(12) United States Patent
Lucey et al.

(10) Patent No.: US 7,193,098 B1
(45) Date of Patent: Mar. 20, 2007

(54) PROCESS FOR PRODUCING SEMICONDUCTOR NANOCRYSTAL CORES, CORE-SHELL, CORE-BUFFER-SHELL, AND MULTIPLE LAYER SYSTEMS IN A NON-COORDINATING SOLVENT UTILIZING IN SITU SURFACTANT GENERATION

(75) Inventors: Derrick W. Lucey, Amherst, NY (US); David J. MacRae, Pendleton, NY (US); Paras N. Prasad, Buffalo, NY (US); Orville T. Beachley, Jr., Buffalo, NY (US)

(73) Assignee: The Research Foundation of State University of New York, Amherst, NY (US)

( * ) Notice: Subject to any disclaimer, the term of this patent is extended or adjusted under 35 U.S.C. 154(b) by 405 days.

(21) Appl. No.: 10/804,629

(22) Filed: Mar. 19, 2004

Related U.S. Application Data

(60) Provisional application No. 60/456,384, filed on Mar. 20, 2003.

(51) Int. Cl.
*C07F 5/00* (2006.01)
*C07F 5/06* (2006.01)
*C30B 7/00* (2006.01)

(52) U.S. Cl. .............. 556/1; 556/20; 556/30; 556/174; 556/176; 556/182; 117/68; 117/70; 117/104

(58) Field of Classification Search ............ 556/1, 556/20, 30, 174, 176, 182; 117/68, 70, 104
See application file for complete search history.

(56) References Cited

U.S. PATENT DOCUMENTS

| | | | |
|---|---|---|---|
| 5,474,591 | A | 12/1995 | Wells et al. |
| 5,505,928 | A | 4/1996 | Alivisatos et al. |
| 6,126,740 | A | 10/2000 | Schulz et al. |
| 6,207,229 | B1 | 3/2001 | Bawendi et al. |
| 6,225,198 | B1 | 5/2001 | Alivisatos et al. |
| 6,306,736 | B1 | 10/2001 | Alivisatos et al. |
| 6,576,291 | B2 | 6/2003 | Bawendi et al. |
| 6,607,829 | B1 | 8/2003 | Bawendi et al. |
| 6,682,596 | B2 | 1/2004 | Zehnder et al. |
| 6,911,082 | B2 | 6/2005 | Sato et al. |
| 2002/0066401 | A1 | 6/2002 | Peng et al. |
| 2003/0097976 | A1 | 5/2003 | Zehnder et al. |

FOREIGN PATENT DOCUMENTS

WO   WO 02/25745   3/2002

(Continued)

OTHER PUBLICATIONS

Li et al., "Large-Scale Synthesis of Nearly Monodisperse CdSe/CdS Core/Shell Nanocrystals Using Air-Stable Reagents via Successive Ion Layer Adsorption and Reaction," *J. Am. Chem. Soc.*, 125:12567-12575 (2003).

(Continued)

*Primary Examiner*—Porfirio Nazario-Gonzalez
(74) *Attorney, Agent, or Firm*—Nixon Peabody LLP

(57) ABSTRACT

A process for producing semiconductor nanocrystal cores, core-shell, core-buffer-shell, and multiple layer systems is disclosed. The process involves a non-coordinating solvent and in situ surfactant generation.

36 Claims, 15 Drawing Sheets

FOREIGN PATENT DOCUMENTS

| | | |
|---|---|---|
| WO | WO 02/29140 | 4/2002 |
| WO | WO 03/012006 | 2/2003 |

OTHER PUBLICATIONS

Borchert et al., "Investigation of ZnS Passivated InP Nanocrystals by XPS," *Nano Lett.*, 2:151-154 (2002).

Haubold et al., "Strongly Luminescent InP/ZnS Core-Shell Nanoparticles," *Chem. Phys. Chem.*, 5:331-334 (2001).

Mićić et al., "Core-Shell Quantum Dots of Lattice-Matched ZnCdSe$_2$ Shells on InP Cores: Experiment and Theory," *J. Phys. Chem. B*, 104:12149-12156 (2000).

Beachley et al., "Chemistry of In(C$_5$H$_5$)$_3$ and Some Heteroleptic Organoindium (III) Derivatives Crystal and Molecular Structures of In(C$_5$H$_5$)$_3$, (C$_5$H$_5$)$_3$In·PPh$_3$, and (Me$_3$CCH$_2$)$_2$In(C$_5$H$_5$)," *Organometallics*, 21:4632-4640 (2002).

Battaglia et al., "Formation of High Quality InP and InAs Nanocrystals in a Noncoordinaing Solvent," *Nano Lett.*, 2:1027-1030 (2002).

Coates, "Trimethylgallium. Part I. The Relative Stabilities of its Coordination Compounds with the Methyl Derivatives of Groups VB and VIB, and the Thermal Decomposition of Some Trimethylgallium-Amine Complexes," *J. Chem. Soc.*, pp. 2003-2013 (1951).

Park et al., "Cis-Trans Isomerization and Structure of Dimeric [Me$_2$Ga(μ-NH$^t$Bu)]$_2$," *Organometallics*, 11:3320-3323 (1992).

Coates et al., "Trimethylgallium. Part III. Reaction with Diphenylphosphine and -arsine," *J. Chem. Soc.*, pp. 233-237 (1963).

Waggoner et al., "Reactions of Trimethylaluminum or Trimethylgallium with Bulky Primary Amines: Structural Characterization of the Thermolysis Products," *J. Am. Chem. Soc.*, 113:3385-3393 (1991).

Beachley et al., "Room Temperature Cyclopentadiene Elimination Reaction for the Synthesis of Diethylgallium-Amides, -Phosphides, and -Thiolates. Crystal and Molecular Structures of [Et$_2$GaP(t-Bu)$_2$]$_2$ and [Et$_2$GaS(SiPh$_3$)]$_2$," *Organometallics*, 15:3653-3658 (1996).

Maury et al., "Raman Spectroscopy Characterization of Polycrystalline GaP Thin Films Grown By MO-CVD Process Using [Et$_2$Ga - PEt$_2$]$_3$ as Only Source," *J. Phys. (Paris)*, 43:CI-347-CI-352 (1982).

Maury et al., "Synthesis and Characterization of Diethylphosphino Ga(III) and In(III) Complexes woth Covalent Metal-Phosphorous Bonds," *Polyhedron*, 3:581-584 (1984).

Storr et al., "Cyclic Imino Derivatives of Aluminium, Gallium, and Indium Dialkyls," *J. Chem. Soc.*, pp. 3850-3854 (1971).

Storr, "Trimeric Methylaminogallane, (MeNHGaH$_2$)$_3$ and Related Compounds," *J. Chem. Soc.*, pp. 2605-2608 (1968).

Beachley et al., "Use of Me$_2$Ga(C$_5$H$_5$) To Prepare (Me$_2$GaERR')n (E=N, P) at or Below Room Temperature and the Crystal and Molecular Structure of [Me$_2$GaP(Me)(Ph)]$_3$," *Organometallics*, 12:1976-1980 (1993).

Beachley et al., "Cyclopentadiene Elimination Reaction as a Route to Bis(neopentyl)gallium Phosphides. Crystal and Molecular Structures of (Me$_3$CCH$_2$)$_2$ and [(Me$_3$CCH$_2$)$_2$GaP(C$_6$H$_{11}$)$_2$]$_2$," *Organometallics*, 16:3267-3272 (1997).

Beachley et al., "Cyclopentadiene Elimination Reactions for the Preparation of Organoindium(III) Derivatives. Crystal and Molecular Structures of Me$_2$In(acac), (Me$_3$CCH$_2$)$_2$In(acac), (Me)(Me$_3$CCH$_2$)In(acac), and [Me$_2$InNH(t-Bu)]$_2$," *Organometallics*, 22:3991-4000 (2003).

Beachley et al., "Chemistry of Indium(III) Tris(cyclopentadienide). Reactions with Diphenylphosphine, *tert*-Butyl Alcohol, and Acetylacetone. Cyclopentadiene and Reductive Elimination Reactions," *Organometallics*, 22:1690-1695 (2003).

Furis et al., "Spectroscopic Studies of InP Nanocrystals Synthesized Through a Fast Reaction," Proceedings of the MRS-Materials Research Symposuim, (2003) (Abstract).

Cartwright et al., "Ultrafast Dynamics in Nanostructured Materials," Proceedings of SPIE-The International Society for Optical Engineering, 5222(Nanocrystals, and Organic and Hybrid Nanomaterials), 134-139 (2003) (Abstract).

PROCESS FOR PRODUCING SEMICONDUCTOR NANOCRYSTAL CORES, CORE-SHELL, CORE-BUFFER-SHELL, AND MULTIPLE LAYER SYSTEMS IN A NON-COORDINATING SOLVENT UTILIZING IN SITU SURFACTANT GENERATION

This application claims the benefit of U.S. Provisional Patent Application Ser. No. 60/456,384, filed Mar. 20, 2003, which is hereby incorporated by reference in its entirety.

This invention arose out of research sponsored by the U.S. Air Force Office of Scientific Research (AFOSR Grant No. F496200110358) The U.S. Government may have certain rights in this invention.

FIELD OF THE INVENTION

This invention relates to a process for producing III-V or II-VI nanocrystals, core-shell, core-buffer-shell, and multiple layer systems.

BACKGROUND OF THE INVENTION

There is considerable interest in processes for the preparation of semiconductor nanocrystals, the applications for which include, for example, optical communications, photonic chips, photovoltaic devices, and biolabels for bioimaging. Traditional preparative routes to III-V semiconductor nanocrystals require the use of coordination solvents such as trioctylphosphine oxide ("TOPO") or dodecylamine ("DA") and generally require long reaction times at high temperatures (i.e., 3–6 days at ~300–400° C.). See, for example, U.S. Pat. No. 6,306,736 to Alivisatos et al. Decomposition products resulting from these methods have been shown to possess optical properties which have the potential to interfere with the optical properties of the desired III-V nanocrystals. Moreover, the III-V semiconductor nanocrystals prepared by these methods are generally polydispersed (1–20 nm) and the results are somewhat erratic or irreproducible. An added disadvantage is that when any of the commonly utilized surfactants are exposed to high temperatures (>100° C.), their optical properties also have the potential to mask or obscure the optical properties of the desired nanocrystals.

Other existing preparation technologies include Molecular Beam Epitaxi (MBE) and Chemical Vapor Deposition (CVD). However, although both of these methods are excellent techniques for the preparation of thin film or bulk III-V semiconductor materials, neither technique is capable of producing monodispersed III-V semiconductor nanocrystals and neither offers control or exchange of the surface capping material which would allow incorporation of the semiconductor nanocrystals into desired host matrices.

Compounds of the type $M(ER_x)_3$ (M=Group III metal; E=Group V or Group VI element; R=organic group; x=1 if E is Group VI element, and x=2 if E is Group V element) may be used as precursors for the synthesis of III-V semiconductor nanocrystals. The best precursors should be soluble in non-coordinating organic solvents, that have high boiling and high decomposition temperatures, and which can be prepared in very high purity. The typical synthetic routes to these types of compounds are either hydrocarbon elimination reactions (Equation 1) or metathesis reactions (Equation 2).

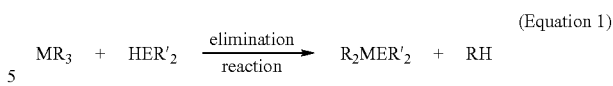

The major source of impurities in precursors prepared by the elimination reactions originates with the high temperatures needed to initiate the elimination reaction between the pure starting materials, the organo group III compound, and the Group V compound. Elimination reactions for gallium-nitrogen systems require 100–130° C., whereas gallium-phosphorus compounds need 110–150° C. For example, the compounds $[Me_2GaNH_2]_3$, $[Me_2GaN(H)(Me)]_3$, $[Me_2GaNMe_2]$, $[Me_2GaN(H)(t-Bu)]_2$, and $[Me_2GaNPh_2]_2$ were prepared from the neat reagents, $GaMe_3$, and the corresponding amine, at 90, 125, 125, 110, and 120° C., respectively (Coates, *J. Chem. Soc.* 1951 (2003); Park et al., *Organometallics* 11:3320 (1992); and Coates et al., *J. Chem. Soc.* 233 (1963)), whereas $[Me_2GaN(H)Ph]_2$, $[Me_2GaN(H)Ad]_2$ (Ad=1-adamantyl), and $[Me_2GaN(H)Dipp]_2$ (Dipp=2,6-i-$Pr_2C_6H_3$) were formed from $GaMe_3$ and the corresponding amine in refluxing toluene (bp 110° C.). Waggoner et al. *J. Am. Chem. Soc.* 113:3385 (1991). The diethylgallium-nitrogen, diethylgallium-thiol and diethylgallium-phosphorus compounds $[Et_2GaS(SiPh_3)]_2$, $[Et_2GaPEt_2]_2$ and $[Et_2GaN(C_2H_4)]_2$ have been prepared directly from $GaEt_3$ and $HS(SiPh_3)$, $HPEt_2$ and $HN(C_2H_4)$, respectively, neat at 70, 100–150 and 110–150° C., respectively. Beachley et al., *Organometallics* 15:3653–3658 (1996); Maury et al. *J. Phys (Paris)* 43:C1–347 (1982); Maury et al., *Polyhedron* 3:581 (1984); and Storr et al., *J. Chem. Soc. A* 3850 (1971). The gallium-phosphorus compounds, $[Me_2GaPMe_2]_3$, $[Me_2GaPEt_2]_2$, and $[Me_2GaPPh_2]_2$, required heating the corresponding neat reagents to 150, 160 and 110° C., respectively. Beachley et al., *J. Chem. Soc. A* 2605 (1968) and Coates, *J. Chem. Soc.* 1951 (2003). It is noteworthy that when $GaMe_3$ and $H_2NMes$ (Mes=2,4,6-$MeC_6H_2$) were combined in refluxing toluene and then heated at 190° C., products indicative of orthometalation reaction were observed. Waggoner et al. *J. Am. Chem. Soc.* 113:3385 (1991). Metathesis reactions on the other hand, require more reagents with multistep synthesis and typically require the use of ether solvents. Since each new reagent or solvent introduces the possibility of impurities, the simplest reaction should give the purest product.

The reaction between $Me_2Ga(C_5H_5)$ and a primary and/or secondary amine or a phosphine (Equation 3) occurs at or below room temperature and provides a convenient, low-temperature route to gallium-nitrogen and gallium-phosphorus compounds of high purity. Beachley et al., *Organometallics* 12:1976–1980 (1993).

The compounds $[Me_2GaNH_2]_3$, $[Me_2GaN(H)(Me)]_3$, $[Me_2GaN(H)(t-Bu)]_2$, $[Me_2GaN(H)(C_6H_{11})]_2$, $[Me_2GaNEt_2]_2$, $[Me_2GaN(Me)(C_6H_{11})]_2$, $[Me_2GaN(Me)(Ph)]_2$, $[Me_2GaN(Et)(Ph)]_2$, $[Me_2GaP(C_6H_{11})_2]_2$, $[Me_2GaP(Me)(Ph)]_3$, and $[Me_2GaPPh_2]_2$ were all prepared at room temperature or below, displaying the ease of cyclopentadiene elimination over methane elimination in gallium organometallic complexes. Beachley et al., *Organometallics* 12:1976–1980 (1993). The reactions of $Et_2Ga(C_5H_5)$ with HNEt$_2$, HN(H)Me, HN(H)(t-Bu), HP(i-Pr)$_2$, HP(t-Bu)$_2$ and HS(SiPh$_3$) in benzene or pentane provide convenient room temperature routes to the preparation of [Et$_2$GaNEt$_2$]$_2$, [Et$_2$GaN(H)Me]$_2$, [Et$_2$GaN(H)(t-Bu)]$_2$, [Et$_2$GaP(i-Pr)$_2$]$_2$, [Et$_2$GaP(t-Bu)$_2$]$_2$, and [Et$_2$GaS(SiPh$_3$)]$_2$ through cyclopentadiene elimination over ethane elimination. Beachley et al., *Organometallics* 15:3653–3658 (1996). The compound [(Me$_3$CCH$_2$)$_2$GaPEt$_2$]$_2$ was prepared readily at room temperature by combining Ga(CH$_2$CMe$_3$)$_3$, Ga(C$_5$H$_5$)$_3$, and HPEt$_2$ in a 2:1:3 mol ratio, respectively, in pentane. Beachley et al., *Organometallics* 16:3267–3272 (1997). This displays the ease of elimination of cyclopentadiene over neopentane, as upon dissolution of Ga(CH$_2$CMe$_3$)$_3$, Ga(C$_5$H$_5$)$_3$ in a 2:1 ratio, the major species present in solution due to ligand redistribution is (Me$_3$CCH$_2$)$_2$Ga(C$_5$H$_5$) which reacts, in turn, with HPEt$_2$ to form the resultant product with no side products or bye-products that would come from neopentane elimination. Thus, for organometallic gallium complexes, cyclopentadiene elimination occurs in preference to methane, ethane and neopentane elimination pathways.

It has recently been discovered that similar cyclopentadiene reactions occurred readily with indium complexes (Equation 4).

R$_2$In(C$_5$H$_5$)+HER'R''→1/n[R$_2$InER'R'']$_n$+C$_5$H$_6$ (Equation 4)

The compounds with the simplest formula Me$_2$InO(t-Bu), Me$_2$In(acac) (acac=acetylacetonate), Me$_2$InPPh$_2$, Me$_2$InS (SiPh$_3$), (Me$_3$CCH$_2$)$_2$InO(t-Bu), (Me$_3$CCH$_2$)$_2$In(acac), (Me$_3$CCH$_2$)$_2$InPPh$_2$, (Me$_3$CCH$_2$)$_2$InS(SiPh$_3$), and (C$_5$H$_5$)$_2$InO(t-Bu) were prepared at room temperature or below through cyclopentadiene elimination. Beachley et al., *Organometallics* 22:1690–1695 (2003) and Beachley et al., *Organometallics* 22:3991–4000 (2003). Neither methane nor neopentane elimination reactions were observed, and this chemistry demonstrates that cyclopentadiene elimination occurs readily for organoindium complexes.

Traditional preparative routes to II–VI semiconductor nanocrystals require the use of either a coordinating solvent (phosphorus, nitrogen or oxygen based) or a surfactant (phosphorus, nitrogen or oxygen based) and/or a mixture of coordinating solvent and surfactant. See, for example, U.S. Pat. No. 6,225,198 to Alivisatos et al. Also, these traditional preparative routes generally require long reaction times at high temperatures with most of these approaches utilizing very dangerous and reactive metal precursors (i.e., CdMe$_2$ and ZnEt$_2$). Traditional methods of preparing shell materials also require the utilization of coordinating solvents (such as those solvents listed above) and the preparation of elaborate mixtures of metal precursors.

Moreover, current technologies for III–V semiconductor nanocrystals synthesis are dedicated strictly to using commercially available precursors. The most common precursors are the M$^{III}$(halides)$_3$. When utilizing these precursors, the resultant semiconductor nanocrystals have the propensity to have halide impurities. These impurities hinder the desired electronic or optical properties of the nanocrystals.

The present invention is directed at overcoming these and other deficiencies in the art.

SUMMARY OF THE INVENTION

One aspect of the present invention relates to a process for producing III–V or II–VI nanocrystals. This involves reacting a compound of formula (I) with a compound of formula (II) under conditions effective to produce homogeneous nucleation of seed III–V or II–VI nuclei and a compound of formula (III). The seed nuclei and the compound of formula (III) further react with controlled growth to produce III–V or II–VI nanocrystals.

Formula (I) is ML$_n$ and Formula (II) is E(SiR$_3$)$_n$, where n is 3, M is a Group III metal, and E is a Group V element, or n is 2, M is a Group II metal, and E is a Group VI element; L is a ligand; and R is H, —(CH$_2$)$_m$CH$_3$, —(C(CH$_3$)$_2$)$_m$CH$_3$, —(C(CH$_3$)$_2$)$_m$(CH$_2$)$_z$CH$_3$, —(CH$_2$)$_m$(C(CH$_3$)$_2$)$_z$CH$_3$, or any combination thereof, where m and z are real numbers.

Formula (III) is LSiR$_3$.

Another aspect of the present invention is a process for producing nanocrystals having multiple layers of III–V or II–VI material. The process involves reacting a compound of formula (I) with a compound of formula (II) under conditions effective to produce homogeneous nucleation of seed III–V or II–VI nuclei and a compound of formula (III). The seed nuclei and the compound of formula (III) further react with controlled growth to form III–V or II–VI nanocrystals. The III–V or II–VI nanocrystals are then reacted with a source of a Group III metal and a Group V element, or a source of a Group II metal and a Group VI element, under conditions effective to produce nanocrystals having multiple layers of III–V or II–VI material.

Yet another aspect of the present invention is a process for producing nanocrystals having multiple III–V or II–VI layers that involves reacting seed III–V or II–VI nanocrystals with a source of a Group III metal and a Group V element, or a source of a Group II metal and a Group VI element, under conditions effective to produce nanocrystals having multiple layers of III–V of III–VI material.

Another aspect of the present invention is a process for producing compounds useful as Group III precursors for producing III–V nanocrystals in accordance with processes of the present invention. The process involves reacting a compound of formula (V) with a compound of formula (VI) under conditions effective to produce compounds of formula (VII). Compounds of formula (VII) are equivalent to compounds of formula (I) when M is a Group III metal, and thus, may be used according to processes of the invention to produce III–V nanocrystals.

Formula (V) is M$^1$(C$_5$R$^2$$_k$H$_{5-k}$)$_3$, where M$^1$ is a Group III metal; k is 0–5; R$^2$ is H, —(CH$_2$)$_m$CH$_3$, —(C(CH$_3$)$_2$)$_m$CH$_3$, —(C(CH$_3$)$_2$)$_m$(CH$_2$)$_z$CH$_3$, —(CH$_2$)$_m$(C(CH$_3$)$_2$)$_z$CH$_3$, or any combination thereof, where m and z are real numbers.

Formula (VI) is HER$^3$$_x$, where x is 2 and E is a Group V element, or x is 1 and E is a Group VI element; and R$^3$ is H, —(CH$_2$)$_m$CH$_3$, —(C(CH$_3$)$_2$)$_m$CH$_3$, —(C(CH$_3$)$_2$)$_m$(CH$_2$)$_z$CH$_3$, —(CH$_2$)$_m$(C(CH$_3$)$_2$)$_z$CH$_3$, or any combination thereof, where m and z are real numbers, and when x is 1, R$^3$ may additionally be C(O)R$^3$.

Formula (VII) is M$^1$(ER$^3$$_x$)$_3$.

The present invention affords the reliable and reproducible preparation of high quality nanocrystals, in particular, semiconductor nanocrystals, in near monodispersity at low reaction temperatures in significantly shorter times (e.g., 1–24 hours at 270° C. for III–V semiconductor nanocrystals) than existing technologies. The present invention also allows for the rapid synthesis of nanocrystals having multiple layers of III–V or II–VI material, such as, for example, core-shell, core-buffer-shell, or other multiple layer systems. The nanocrystals are prepared in non-coordinating solvents without the necessity of any added surfactant, ligand and/or coordinating solvent. The shell materials can be synthesized rapidly, with size-control, at low temperatures (e.g., <200° C.). The shell preparation allows for excellent surface passivation resulting in a dramatic increase in the quantum efficiency of the core particles. In multiple layer systems, each layer can be tuned to give the desired optical properties depending on the individual layer composition and size. The individual layers of the nanocrystals may be formed of the same III-V or II-VI materials, or any combination thereof. For example, the core may be any III-V or II-VI material, a second layer may be any III-V or II-VI material, a third layer may be any III-V or II-VI material, etc. As such, the resultant nanocrystals are dispersible in common solvents, allowing for many uses. The nanocrystals may be used, for example, for microelectronics, for photovoltaics, for bioimaging, for incorporation in different solid matrices using sol-gel processed glass and polymers, and for making binary as well as ternary and quaternary systems.

The Group III precursors prepared in accordance with the present invention do not contain halide impurities, and do not require coordinating solvents or surfactants that upon extended exposure to high temperatures may obscure the electronic and optical properties of the resultant III-V nanocrystals.

The processes of the present invention solve the problems of traditional methods by rapid generation of III-V or II-VI nanocrystals (minutes) with concomitant formation of a surface capping material (through in situ surfactant generation). The rapidity of the reaction reduces the time required at elevated temperatures, thereby drastically reducing or eliminating the decomposition products associated with traditional preparative methods. The processes of the present invention permit very reproducible preparation of III-V and II-VI nanocrystals with excellent size control and yields nanocrystals whose surface modification is easily afforded. The new preparative route offers the potential to be scaled to commercial capacities.

The processes of the present invention directed to preparative routes to core-shell, core-buffer-shell, and other multiple layer nanocrystals, improve upon traditional methods of producing these types of particles by avoiding the use of elaborate, and possibly detrimental, surfactants or coordinating solvents. The processes are also considerably faster, leading to much less expensive and easily scalable synthesis of these highly luminescent particles.

BRIEF DESCRIPTION OF THE DRAWINGS

FIG. 4A is an absorbance plot and FIG. 4B is a photoluminescence plot excitation set at 400 nm for all times.

FIG. 5A is an absorbance plot and FIG. 5B is a photoluminescence plot excitation set at 400 nm for all times.

FIG. 7A is an absorbance plot and FIG. 7B is a photoluminescence plot excitation set at 400 nm for all times.

FIG. 8A is an absorbance plot and FIG. 8B is a photoluminescence plot excitation set at 400 nm for all times.

FIG. 12A is an absorbance plot and FIG. 12B is a photoluminescence plot excitation set at 400 nm for all times.

FIG. 13A is an absorbance plot and FIG. 13B is a photoluminescence plot excitation set at 400 nm for all times.

FIG. 15A is an absorbance plot and FIG. 15B is a photoluminescence plot excitation set at 400 nm for all times.

DETAILED DESCRIPTION OF THE INVENTION

The present invention relates to a process for producing III-V or II-VI nanocrystals that involves reacting a compound of formula (I) with a compound of formula (II) under conditions effective to produce homogeneous nucleation of seed III-V or II-VI nuclei and a compound of formula (III). The seed nuclei and the compound of formula (III) then further react with controlled growth to form III-V or II-VI nanocrystals.

Formula (I) is $ML_n$ and Formula (II) is $E(SiR_3)_n$. Where n is 3, M is a Group III metal and E is a Group V element. Group III metals may include, for example, aluminum ("Al"), gallium ("Ga"), and indium ("In"). Group V elements may include, for example, nitrogen ("N") phosphorus ("P"), arsenic ("As"), and antimony ("Sb").

Where n is 2, M is a Group II metal and E is a Group VI element. Group II metals may include, for example, zinc ("Zn"), cadmium ("Cd"), magnesium ("Mg"), and mercury ("Hg"). Group VI elements may include, for example, be oxygen ("O"), sulfur ("S"), selenium ("Se"), or tellurium ("Te").

L is a ligand capable of forming a complex with M. As used here, ligand refers to an organic molecule that donates the necessary electrons to form coordinate covalent bonds with M. The particular choice of ligand is within the knowledge of those skilled in the relevant art. According to the invention, ligands may include, for example, $—E^1R^1_2$, $—E^2R^1$, $—E^2C(O)R^1$, and beta-diketonates or beta-diketonate derivatives.

$E^1$ is a Group V element, and $E^2$ is a Group VI element. $R^1$ may, for example, be H, $—(CH_2)_mCH_3$, $—(C(CH_3)_2)_mCH_3$, $—C(CH_3)_2)_m(CH_2)_zCH_3$, $—(CH_2)_m(C(CH_3)_2)_zCH_3$, or any combination thereof, where m and z are real numbers.

R may, for example, be H, —$(CH_2)_m CH_3$, —$(C(CH_3)_2)_m CH_3$, —$(C(CH_3)_2)_m(CH_2)_z CH_3$, —$(CH_2)_m(C(CH_3)_2)_z CH_3$, or any combination thereof, where m and z are real numbers. R is preferably, alkyl, and more preferably, methyl.

Formula (III) is $LSiR_3$.

Preferably, the compound of formula (I) is present in solution with a non-coordinating solvent, such as, for example, benzene, toluene, xylene, decane, octadecene, or the like. With lower boiling point solvents, such as benzene, toluene, hexanes, decane, etc., a high pressure reactor may be used. Preferably, the compound of formula (II) is added to a solution containing the compound of formula (I).

In comparison to conventional methods for producing III-V or II-VI nanocrystals, the process of the present invention produces high quality nanocrystals in near monodispersity and requires low reaction temperatures and significantly shorter reaction times. Reaction temperatures may, for example, be in the range of about 150–300° C. Reaction times may, for example, range from minutes to a few hours. These conditions are in contrast to conventional methods, which typically use high boiling coordinating solvents and require long reaction temperatures and times (e.g. 300–400° C. for 3 to 6 days).

Figure 2:
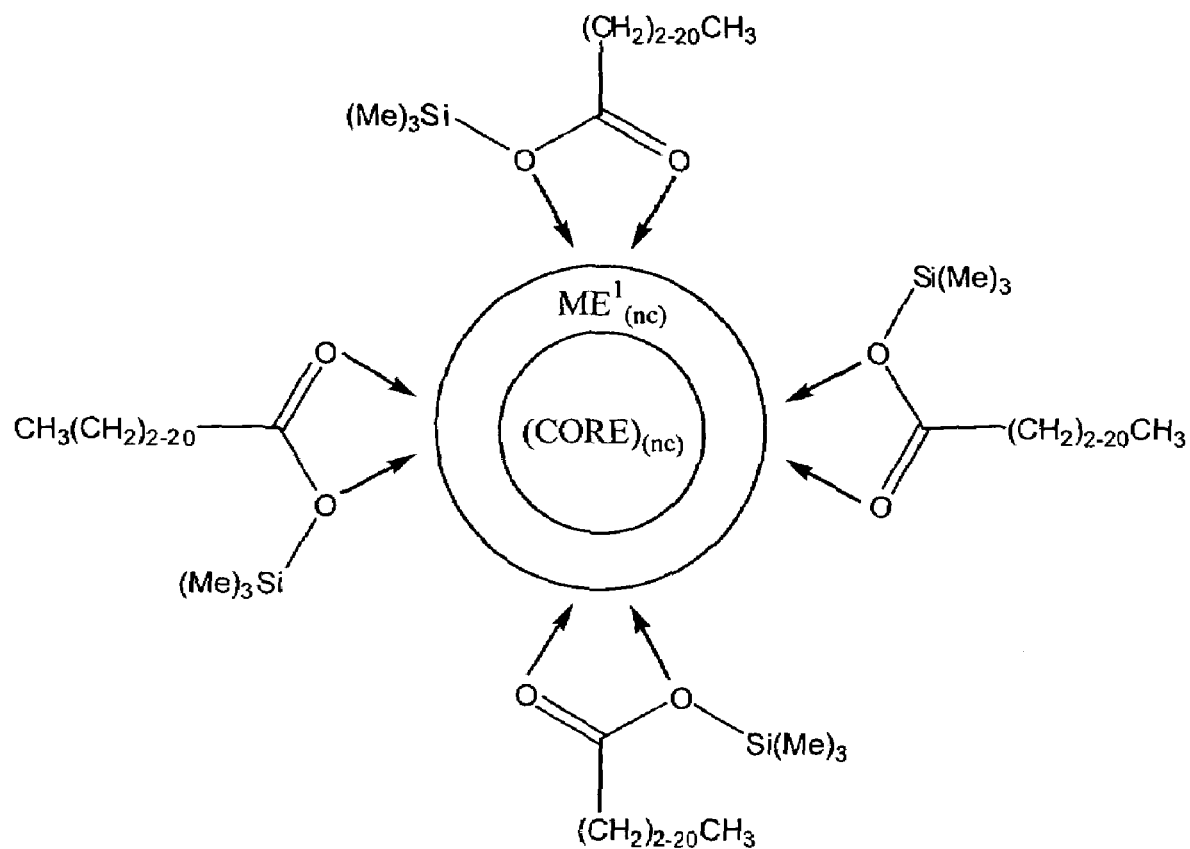
FIG. 2 is a schematic representation of a core-shell multiple layer III-V or II-VI nanocrystal of the present invention.
Figure 3:
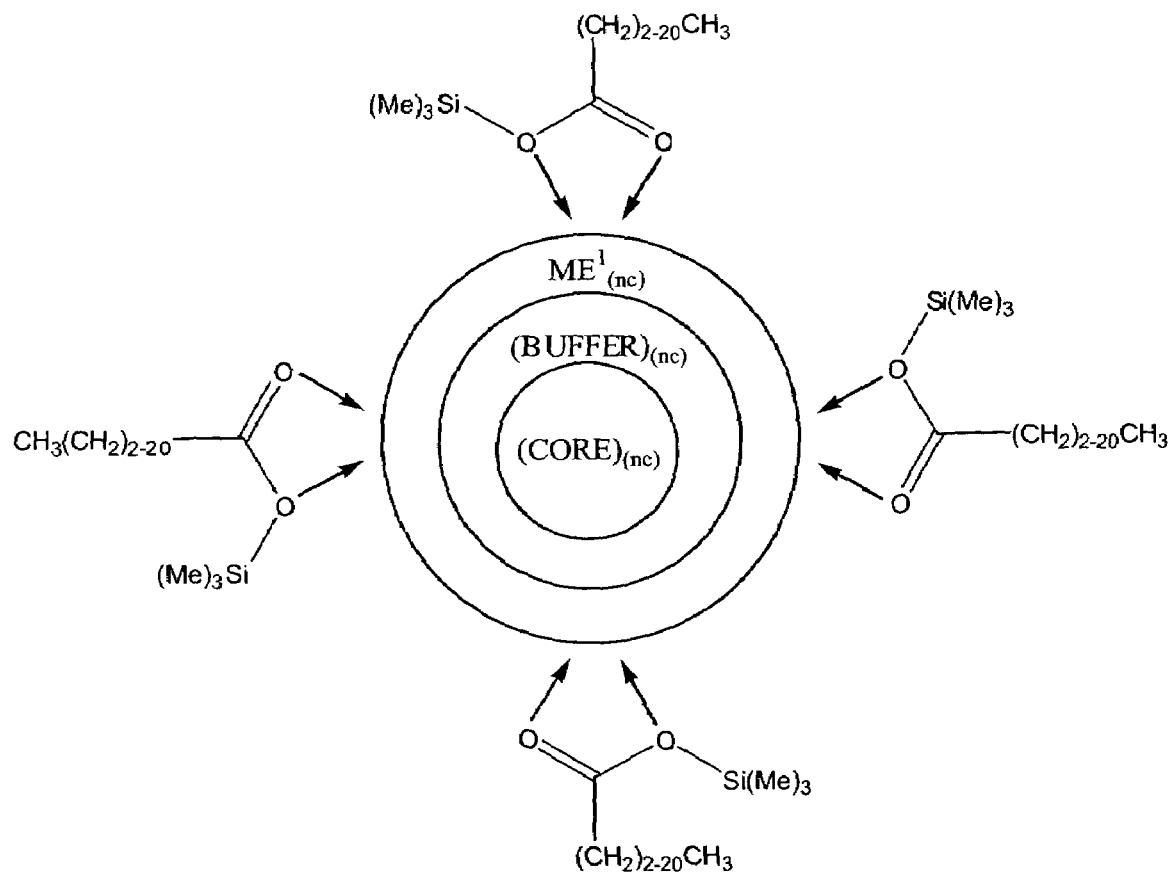
FIG. 3 is a schematic representation of a core-buffer-shell multiple layer III-V or II-VI nanocrystal of the present invention.

Another aspect of the present invention allows for the production of nanocrystals having multiple layers of III-V or II-VI material. According to the process, III-V or II-VI nanocrystals (seed crystals) are reacted with a source of a Group III metal and a Group V element, or a source of a Group II metal and a Group VI element, under conditions effective to produce nanocrystals having multiple layers of III-V or II-VI material. A multiple layer, core-shell nanocrystal is depicted in FIG. 2. The core-shell nanocrystals may further be reacted with the same, or a different, source of a Group III metal and a Group V element, or source of a Group II metal and a Group VI element, under conditions effective to produce a third layer of III-V or II-VI material on the nanocrystals. A multiple layer, core-buffer-shell nanocrystal is depicted in FIG. 3. Moreover, the reacting step may be repeated one or more additional times such that the resulting product of each sequential reacting step is reacted with the same, or different, source of a Group III metal and a Group V element, or source of a Group II metal and a Group VI element, under conditions effective to produce a layer of III-V or II-VI material on the nanocrystals.

Each sequential reacting step may involve reacting the nanocrystals with the same, or different, shell precursor materials. Accordingly, the individual layers of the multiple layer nanocrystals may be formed of the same, or different III-V or II-VI materials, and the resulting nanocrystals may include layers of the same, or different, III-V materials, as well as, layers of the same, or different, II-VI materials. For example, the core may be any III-V or II-VI material, a second layer may be any III-V or II-VI material, a third layer may be any III-V or II-VI material, a fourth layer may be any III-V or II-VI material, etc. Where the sequential layers are to be of the same material, the reactions may be carried out according to a one pot synthesis, as describe, for example, in Example 21, below.

The source of a Group III metal, or the source of a Group II metal, may be a compound of formula (IV). Formula (IV) is $MX_n$. Where n is 3, M is a Group III metal, and where n is 2, M is a Group II metal.

X may, for example, be Cl, carboxylate, carbonate, —$E^1R^1_2$, —$E^2R^1$, —$E^2C(O)R^1$, and beta-diketonates or beta-diketonate derivatives, where $E^1$ is a Group V element; $E^2$ is a Group VI element; and $R^1$ may be, for example, H, —$(CH_2)_m CH_3$, —$(C(CH_3)_2)_m CH_3$, —$(C(CH_3)_2)_m(CH_2)_z CH_3$, —$(CH_2)_m(C(CH_3)_2)_z CH_3$, or any combination thereof, where m and z are real numbers.

Preferably, the III-V or II-VI nanocrystals are provided in a solution comprising a non-coordinating solvent, such as, for example, benzene, toluene, xylene, decane or octadecene.

The reaction temperatures and reaction times required for producing each sequential layer of III-V or II-VI material on the nanocrystals are typically even less than those required for the initial nanocrystal formation. Reaction temperatures may, for example, be in the range of about 100–200° C. Reaction times may, for example, range from about 1–4 hours.

Another aspect of the present invention is a process for producing Group III precursors useful in processes of the invention for producing III-V nanocrystals. The process involves reacting a compound of formula (V) with a compound of formula (VI) under conditions effective to produce compounds of formula (VII).

Formula (V) is $M^1(C_5R^2_k H_{5-k})_3$, where $M^1$ is a Group III metal, such as, for example, Al, Ga, or In; $R^2$ is, for example, H, —$(CH_2)_m CH_3$, —$(C(CH_3)_2)_m CH_3$, —$(C(CH_3)_2)_m(CH_2)_z CH_3$, —$(CH_2)_m(C(CH_3)_2)_z CH_3$, or any combination thereof, where m and z are real numbers; and k is 0–5.

Accordingly, compounds of formula (V) include, for example, $In(C_5H_5)_3$, $In(C_5H_4Me)_3$, $In(C_5Me_5)_3$, and $In(C_5H_4(CH_2C(CH_3)_3)$.

Formula (VI) is $HER^3_x$, where x is 2 and E is a Group V element, such as, for example, N, P, As, or Sb, or x is 1 and E is a Group VI element, such as, for example, O, S, Se, or Te; and $R^3$ may be, for example, H, —$(CH_2)_m CH_3$, —$(C(CH_3)_2)_m CH_3$, —$(C(CH_3)_2)_m(CH_2)_z CH_3$, —$(CH_2)_m(C(CH_3)_2)_z CH_3$, or any combination thereof, where m and z are real numbers, and when x is 1, $R^3$ may additionally be $C(O)R^3$.

Accordingly, compounds of formula (VI) include, for example, myristic acid, stearic acid, lauric acid, decanoic acid, 1-octadecanol, 1-octadecanethiol, dodecylamine, dioctadecylamine, dioctylphosphine, diocyadecylarsine, and the like.

Formula (VII) is $M^1(ER^3_x)_3$. Examples of compounds of formula (VII) may include, for example, $In(Myristate)_3$, $In(Laurate)_3$, $In(Stearate)_3$, $In(Decanoate)_3$, $In(octadecanoate)_3$, $In(octadecanethiolate)_3$, $In(N(C_{12}H_{25})_2)_3$, $In(N(C_{18}H_{37})_2)_3$, $In(P(C_{18}H_{37})_2)_3$, $In(As(C_{18}H_{37})_2)_3$, and the like.

EXAMPLES

Example 1

Synthesis of Group III Precursors Through Cyclopentadiene Elimination

The following describes the preparation of very pure Group III precursors which do not contain halide impurities and which do not require the addition of coordinating solvents and/or surfactants for subsequent preparation of semiconductor nanocrystals. Direct synthesis of a series of very pure compounds of the general formula $M(ER_x)_3$ is illustrated in Scheme 1.

Scheme 1
Synthesis of Group III precursors for III-V semiconductor nanocrystal synthesis

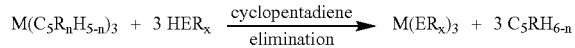

M = Group III element
if x = 2, E = Group V element
if x = 1, E = Group VI element
R = organic group
n = 0 - 5

Even though these complexes might be synthesized directly via the elimination of methane, ethane or neopentane from $MMe_3$, $MEt_3$ or $M(CH_2CMe_3)_3$, respectively, each subsequent elimination of an alkane molecule requires additional time and subsequently higher temperatures, and the isolation of pure $M(ER_x)_3$ complexes becomes very, very difficult. The direct synthesis of $M(ER_x)_3$ from $In(C_5H_5)_3$ and $Ga(C_5H_5)_3$ was conducted according to Scheme 1 at room temperature in less than 4 hours.

Table 1 provides examples of compounds of general formula $HER_x$ that can be used to prepare Group III precursors by cyclopentadiene elimination reactions.

TABLE 1

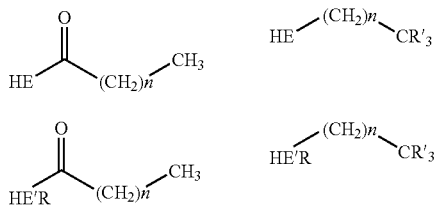

E' = group V element
E = group VI element
R = organic group or H
R' = R, another organic group or H
n = 1, 2, 3, . . . n In the following examples, $In(C_5H_5)_3$ was prepared according to literature. Beachley et al., *Organometallics* 21:4632–4640 (2002), which is hereby incorporated by reference in its entirety. $P(SiMe_3)_3$, Myristic Acid, Stearic Acid, Lauric Acid, Decanoic acid, 1-Octadecene tech (90%), Sulfur, and Selenium were purchased from Aldrich Chemical Co., Inc. (Milwaukee, Wis., USA). $Zn(Ac)_2 \cdot 2H_2O$, $Cd(Ac)_2 \cdot 2H_2O$ and 10 wt % $CdMe_2$ in hexanes were purchased from Strem Chemicals, Inc. (Newburyport, Mass., USA). All solvents were carefully dried by using conventional procedures. All compounds described in the following examples were treated as if they were sensitive to oxygen and moisture and were manipulated either under a purified argon atmosphere in a Vacuum Atmospheres drybox (Vacuum Atmospheres Co., Hawthorne, Calif., USA) or by using standard vacuum line techniques. The first chemical purposefully exposed to air was the InP nanoparticles upon the completion of their synthesis, the CdSe nanocrystals upon completion of their synthesis, and in the CdSe—CdS final nanocrystals after the completion of their one-pot synthesis.

Example 2

Synthesis of $In(Myristate)_3$

A 500 mL three-neck round bottom flask was loaded with 3.4358 grams of $In(C_5H_5)_3$ (11.08 mmoles), 7.6164 grams of Myristic Acid (33.35 mmoles, 3.01 mol equivalents), a stir bar, and equipped with a glass stopper in one-neck, a medium grain scintered frit which has a 300 mL one-neck round bottom connected via a 24/40 ground glass joint and a high-vacuum line adapter. After removal from the glove box, the entire apparatus was connected to the high-vacuum line where approximately 100–150 mL of dry benzene is distilled into the reaction vessel. The benzene was rapidly thawed using warm water and the reaction was stirred for 3–4 hours at room temperature. Next, all of the volatile components were removed by flask to flask distillation and approximately 75–100 mL of dry ether was distilled onto the crude reaction product. Then the sample was filtered through the frit and the volatile ether distilled back onto the product, this process was repeated for three total filtrations. Then the ether was distilled back onto the crude product and finally distilled out of the reaction flask. Next, approximately 75–100 mL of dry pentane was distilled into the flask and the product filtered another three times. At this point the pentane was removed from the reaction vessel by flask to flask distillation and the reaction flask left under dynamic vacuum on the high vacuum line overnight. The sample was taken into the glove box and stored in a large glass vial. Yield 5.1479 (58.3%). Anal. Calcd for $C_{42}H_{81}InO_6$: C, 63.30; H, 10.25. Found: C, 60.57; H, 10.08. $^1H$ NMR ($d_6$-benzene) T 55° C.: δ 7.15 (benzene), δ 2.561 (br, 2H), δ 2.361 (br, 4H), δ 1.82 (br, 2H), δ 1.677 (br, 4H), δ 1.321 (br, 60H), δ 0.919 (br, 9H). $^1H$ NMR ($d_6$-benzene) T 35° C.: δ 7.15 (benzene), δ 2.55 (t, J=7.20 Hz, 2H), δ 1.76 (q, J=7.2 & 6.8 Hz, 2H), δ 1.33 (br, 20H), δ 0.93 (t J 6.8 Hz, 3H). $^1H$ NMR ($d_6$-benzene) T 25° C.: δ 7.15 (benzene), δ 2.56 (t, J=7.20 Hz, 2H), δ 1.76 (q, J=7.2 & 6.8 Hz, 2H), δ 1.33 (br, 20H), δ 0.93 (t J 6.8 Hz, 3H). For comparison Myristic Acid $^1H$ NMR ($d_6$-Benzene) RT: δ 12.57 (br, 1H), δ 7.15 (benzene), δ 2.08 (t, J=7.4 Hz, 2H), δ 1.47 (q, J=7.2 Hz, 4H), δ 1.29–1.13 (br-m, 10H), δ 0.913 (t, J=7.0 Hz, 4H).

Example 3

Synthesis of $In(Laurate)_3$

The procedure described in the synthesis of $In(Myristate)_3$ was followed, and 2.0968 g $In(C5H5)3$ (6.76 mmoles) and 4.1642 g Lauric Acid (20.8 mmoles, 3.08 eq) were used. Yield 3.0469 $In(Laurate)3$, 63.24%. Anal. Calcd for $C_{36}H_{69}InO_6$: C, 60.66; H, 9.76. Found: C, 58.2; H, 10.5. $^1H$ NMR ($d_6$-benzene) T 55° C.: δ 7.15 (benzene), δ 2.59 (br, 2H), δ 1.78 (q, J=7.0 Hz, 2H), δ 1.32 (br, 16H), δ 0.924 (t, J=6.2 Hz, 3H). For comparison Lauric Acid $^1H$ NMR ($d_6$-Benzene) RT: δ 12.72 (br, 1H), δ 7.15 (benzene), δ 2.08 (t, J=7.6 Hz, 2H), δ 1.47 (q, J=7.0 Hz, 2H), δ 1.25–1.13 (br-m, 16H), δ 0.91 (t, J=6.8 Hz, 3H).

Example 4

Synthesis of In(Stearate),

The procedure described in the synthesis of $In(Myristate)_3$ was followed, and 1.4425 g $In(C_5H_5)_3$ (4.65 mmoles) and 3.9700 g Stearic Acid (14.0 mmoles, 3.01 eq), were used. Yield 3.9751 $In(Stearate)_3$, 88.53%. Anal. Calcd for $C_{54}H_{105}InO_6$: C, 67.19; H, 10.96. Found: C, 66.21; H, 11.19.

Example 5

Synthesis of Cd(Stearate)$_2$

Within the glove box, a 500 mL three-neck round bottom flask was loaded with a stir bar and approximately 29.6 mmoles of Stearic Acid (8.4150 g). A glass stopper was connected to one neck, a 45 degree medium grain scintered frit with a 300 mL one-neck round bottom flask was connected to another neck and finally a high-vacuum line adapter was connected to the third neck. The reaction vessel was removed from glove box and immediately connected to the high-vacuum line. After a vacuum was established, approximately 200–250 mL of dry benzene was distilled into the reaction flask. Then the flask was transferred to a Schlenk line and backfilled with Argon. The glass stopper was replaced with a reflux condenser and the high-vacuum line adapter was replaced with a pressure-equalizing addition funnel capped with a rubber septa. The entire time an argon rich atmosphere was maintained, the exclusion of water and oxygen was the main priority. Before starting the reaction, a mark was placed on the pressure-equalizing addition funnel measuring 28 ml. Then via cannula transfer, about 28 mL of CdMe$_2$ (14.0 mmoles) was added to the addition funnel. Once completed, the CdMe$_2$ solution was slowly added to the reaction mixture over a period of 30–45 minutes. Throughout the addition the evolution of a gas is evident (Methane). Upon complete addition of the CdMe$_2$ solution, the reaction vessel was set-up back to the original condition with high-vacuum line adapter and glass stopper and continuously stirred under a mild argon bubble. After 2 hours of stirring, a slight vacuum was established on the Schlenk line. Then the entire apparatus was place on the high-vacuum line where approximately half of the solvent was removed via flask to flask distillation. Then the resulting reaction mixture was filtered through frit and the volatile components were distilled back onto the crude product. This was repeated for a total of three times. Once completed, the remaining volatile components were removed on the high-vacuum line via flask to flask distillation. The product was left under dynamic vacuum overnight at which point the fine white powder was taken into the glove box and used. Yield 96.3%, $^1$H NMR (d$_6$-benzene) T 55° C.: δ 7.15 (benzene), δ 2.04 (br, 2H), δ 1.49 (br, 2H), δ 1.29 (br, 20H), δ 0.903 (br, 3H).

Example 6

Synthesis of Cd(Myristate)$_2$

This was synthesized following the exact procedure as described for Cd(Stearate)$_2$ except only half the amounts of materials were used. 14.0 mmoles of Myristic Acid (3.2054 g) was used along with approximately 14 mL of 10 wt % CdMe$_2$ solution (approximately 7.0 mmoles CdMe$_2$) was added. Yield 83.8%. Anal. Calcd for C$_{28}$H$_{54}$CdO$_4$: C, 59.30; H, 9.60. Found: C, 54.3; H, 9.9. $^1$H NMR (d$_6$-benzene) RT: δ 7.15 (benzene), δ 2.00 (t, J 7.5, 2H), δ 1.47 (br, 2H), δ 1.29 (br, 20H), δ 1.12 (br, 3H). $^1$H NMR (d$_6$-benzene) T 55° C.: δ 7.15 (benzene), δ 2.04 (br, 2H), δ 1.49 (br, 2H), δ 1.29 (br, 20H), δ 0.903 (br, 3H).

Example 7

Synthesis of Cd(Laurate)$_2$

This was synthesized following the exact procedure as described for Cd(Stearate)$_2$. 29.4 mmoles of Lauric Acid (5.8868 g) and approximately 28 mL of 10 Wt % CdMe$_2$ solution (approximately 14.0 mmoles CdMe$_2$) were used. Yield 95.1%.

Example 8

Synthesis of Cd(Decanoate)$_2$

This was synthesized following the exact procedure as described for Cd(Stearate)$_2$. 29.4 mmoles of Decanoic Acid (5.0678 g) and approximately 28 mL of 10 Wt % CdMe$_2$ solution (approximately 14.0 mmoles CdMe$_2$) were used. Yield 96.2%, Anal. Calcd for C$_{20}$H$_{38}$CdO$_4$: C, 52.80; H, 8.42. Found: C, 53.2; H, 9.2. $^1$H NMR (d$_6$-benzene) T 60° C.: δ 7.15 (benzene), δ 2.70 (br, 2H), δ 1.86 (br, 2H), δ 1.37 (br, 12H), δ 0.961 (br, 3H).

Example 9

Preparation of Core Nanocrystals

The reactions and processes occurring in the preparation of core nanocrystals according to the present invention are depicted generally in Equation 5.

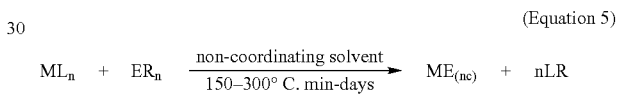

(Equation 5)

$$ML_n + ER_n \xrightarrow[150-300°\ C.\ \text{min-days}]{\text{non-coordinating solvent}} ME_{(nc)} + nLR$$

Figure 1:
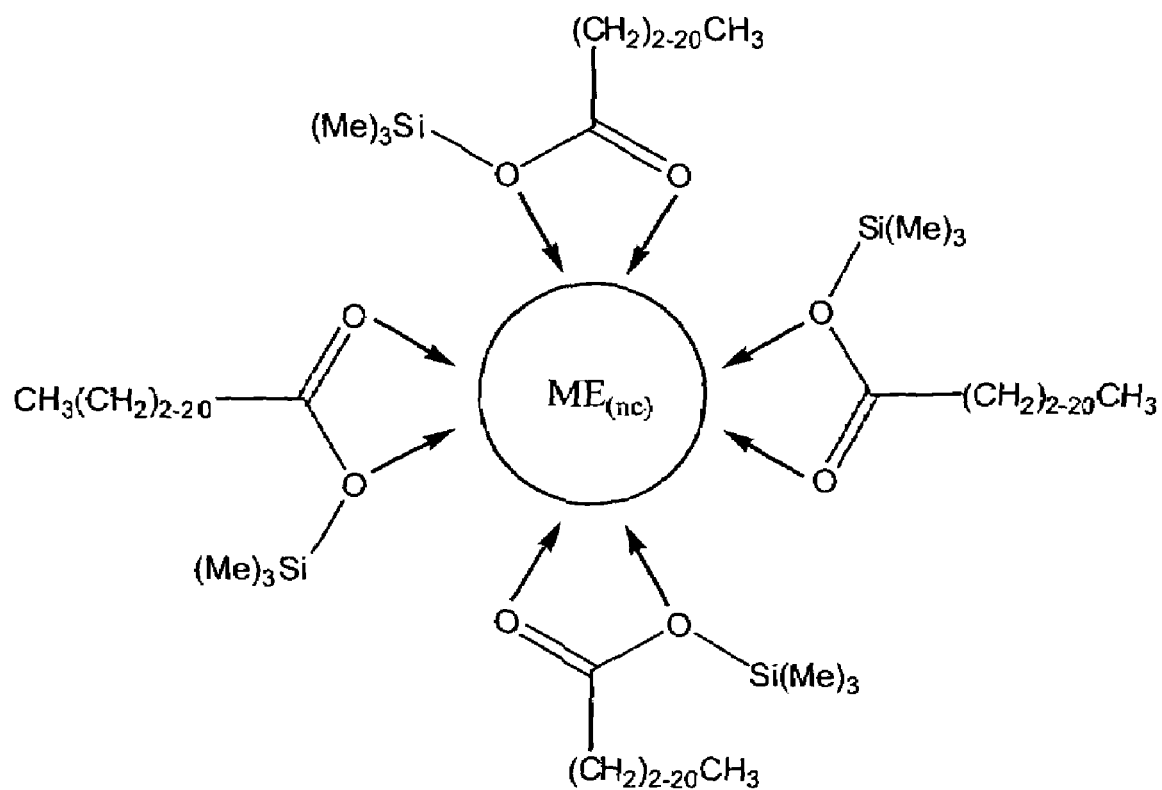
FIG. 1 is a schematic representation of a III-V or II-VI nanocrystal of the present invention.

A semiconductor nanocrystal of the present invention, wherein R is SiMe$_3$ and the ligand, L, is CH$_3$(CH$_2$)$_{2-20}$COO—, is shown in FIG. 1.

The initiation of the reactions occurs when the ER$_n$ source is rapidly injected into a heated solution of ML$_n$ source in the non-coordinating solvent. Upon injection the ER$_n$ and M sources react yielding a seed ME nanocrystal and the elimination product of the reaction (nLR). As shown in FIG. 1, this elimination product then serves as a surface capping material (in situ generated surfactant), which restricts the growth of the nanocrystal. This approach affords the opportunity to control the nanocrystal size, shape, crystallinity and monodispersity by varying concentrations, temperatures and/or the ligand L on the initial ML$_n$ source. As the surface capping material of the nanocrystal is relatively weakly coordinated to the ME nanocrystal surface, it can be readily displaced by other more desirable surface capping agents with the potential to yield semiconductor nanocrystals which are either hydrophilic or hydrophobic, and thereby extending the utility of the nanocrystals to include biological applications where solubility in aqueous solvents is necessary.

Example 10

Preparation of Core-Shell Multiple Layer Nanocrystals

Reactions and processes occurring in the preparation of core-shell multiple layer nanocrystals according to the present invention are depicted generally in Equation 6.

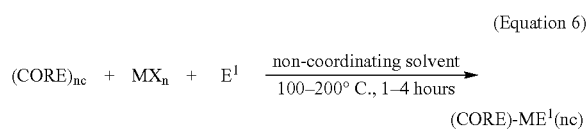

(Equation 6)

A core-shell multiple layer nanocrystal according to the present invention is shown in FIG. 2.

With a seed nanocrystal $(CORE_{(nc)})$ already present, to form the shell layer $(ME^1_{(nc)})$ the shell precursors ($MX_n$ and $E^1$) are added directly to a solution of the seed crystals dissolved in a non-coordinating solvent (most easily the reaction solvent from the seed preparation) at room temperature. The reaction mixture is heated (preferably, not to exceed 200° C.) to allow the formation of the shell layer. By taking aliquots of the reaction mixture, the shell growth is followed by UV-vis and/or PL until all shell materials are used up (typically, 5 min–2 hours). This approach allows for easy control of the thickness of the shell layer by varying the amount of shell material present. As with the seed nanocrystals, the surface capping material is relatively weakly coordinated to the core-shell nanocrystal surface, allowing it to be readily displaced by other more desirable surface capping agents with the potential to yield core-shell nanocrystals which are either hydrophilic or hydrophobic, and thereby extending the utility of the nanocrystals to include biological applications where solubility in aqueous solvents is necessary.

Example 11

Preparation of Core-Buffer-Shell Multiple Layer Nanocrystals

Reactions and processes occurring in the preparation of nanocrystals according to the present invention are depicted generally in Equation 7.

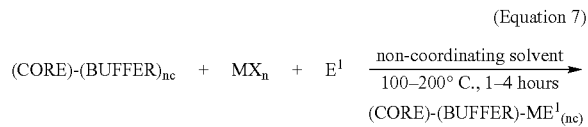

(Equation 7)

A core-buffer-shell multiple layer nanocrystal of the present invention is shown in FIG. 3.

Utilizing the same methodology as is employed in the synthesis of two layer (core-shell) nanocrystals, multiple layer nanocrystals (e.g., core-buffer-shell, etc.) can easily be synthesized. The III-V and II-VI precursors for each layer after the initial seed or core nanocrystal may be the same and are as simple as possible so as to make the synthesis as facile as possible. This allows the ability to easily tailor the synthesis to make any desired multiple layer material.

Example 12

Synthesis of InP Nanocrystals for Temperature Study

Within the glove box the reaction vessel was loaded with a stir bar and the Indium precursor (approximately 250 µmoles). The reaction vessel was fabricated as a three-neck u-bottom flask with the right and left necks being #7 Chem-Thread adaptors (Chemglass, Inc., Vineland, N.J., USA) and the middle neck was a 19/38 Clear Seal® female joint (Wheaton Science Products, Millville, N.J., USA). A reflux condenser was connected to the reaction flask with the male 19/38 Clear Seal® (Wheaton Science Products, Millville, N.J., USA) joint and the condenser top which has a 24/40 ground glass joint was capped with a rubber septa. A glass thermometer holder was placed in the right #7 Chem-Thread adaptor (Chemglass, Inc., Vineland, N.J., USA) while a rubber septa was placed in the other #7 Chem-Thread adaptor (Chemglass, Inc., Vineland, N.J., USA). Also within the glove box, approximately 125 µmoles of $P(SiMe_3)_3$ was loaded into a four-dram vial containing about 4 mL of dry octadecene and capped with a rubber septa. After removal from the glove box, the reaction vessel was placed in a 500 mL round-bottom heating mantle which was filled with sand. Then the reaction vessel was connected to a Schlenk line via the 24/40 ground glass joint atop the reflux condenser and with argon flow, 40 mL of octadecene was added via syringe. Next with the stirrer going, the temperature was set to 100° C. and the reaction vessel placed under vacuum. After 1 hour, the vessel containing a colorless optically clear solution was backfilled with Ar(g) and the temperature is set to the desired reaction temperature (250–300° C.). Once the reaction temperature was reached, the $P(SiMe_3)_3$ solution was rapidly injected via a 10 mL syringe. The solution gradually changed color from clear, colorless to transparent yellow-orange, then transparent orange, then transparent light red, then transparent bright red, then transparent dark red and sometimes to a dark brown almost black color with the rate and extent of color change depending on reaction temperature and time. Aliquots of the reaction mixture (0.5 mL in approximately 5 mL chloroform) were taken at various times to be able to follow the growth process. All reactions were stopped after 2 hours by removing from the heat source and gradually cooling to room temperature. UV-vis and photoluminescence ("PL") analysis was done on all aliquots without any further workup or treatment.

Example 13

Synthesis of InP Cores Used to Make Core-Shell Nanoparticles

A three-neck reaction vessel was loaded with 402.0 mg (504 µmoles) $In(Myr)_3$, a stir bar and equipped with a glass thermometer holder, a condenser and a rubber septum within the glove box. A small 5 dram vial was loaded with 60.3 mg (241 µmoles) $P(SiMe_3)_3$ followed by approximately 3–4 ml of octadecene ("ODE") then sealed with a rubber septum. After removal from the glove box, the reaction vessel was connected to the Schlenk line and with Ar(g) pressure 30–40 ml of ODE was added. Then the entire reaction vessel was placed under vacuum and the temperature was set to 110° C. After 30–45 min, the reaction vessel was backfilled with Ar(g) and the temperature was set to 305° C. Once the temperature reached 300° C., the phosphine solution was rapidly injected and the reaction was considered started (T=0 m). At exactly 60 sec, 20 ml of ODE was rapidly added via syringe. Then at 85 sec an additional 10–20 ml of ODE was added (enough to double the initial reaction volume). Then immediately after the final injection of ODE, the temperature was set to 200° C. After 5 min and 2 hours, an aliquot of 0.5 ml of the reaction mixture was placed in 5–8 ml of CHCl$_3$. After 2 hours, the reaction vessel was removed from the heat and allowed to cool to room temperature with stirring. Once at room temperature, the entire reaction solution was distributed equally into two centrifuge tubes and centrifuged for 40 min at 20° C. and at 10,000 rpm. After completion, the supernatant was used further as the InP cores. The precipitate that was left over was the excess In(Myr)$_3$ and was disposed of properly.

Example 14

Synthesis of InP Nanocrystals

Figure 4A:
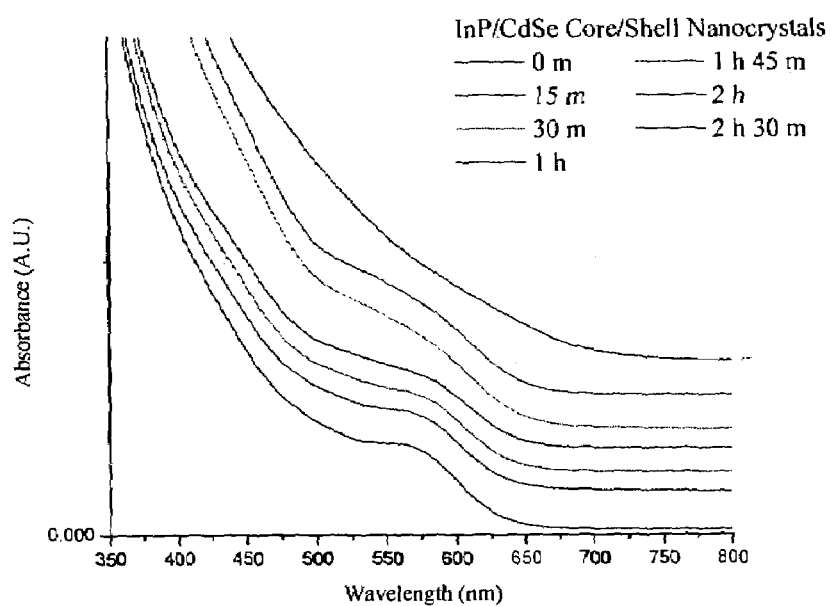
FIGS. 4A and 4B are graphic representations showing Uv-vis and PL of aliquots of InP nanocrystals.
Figure 4B:
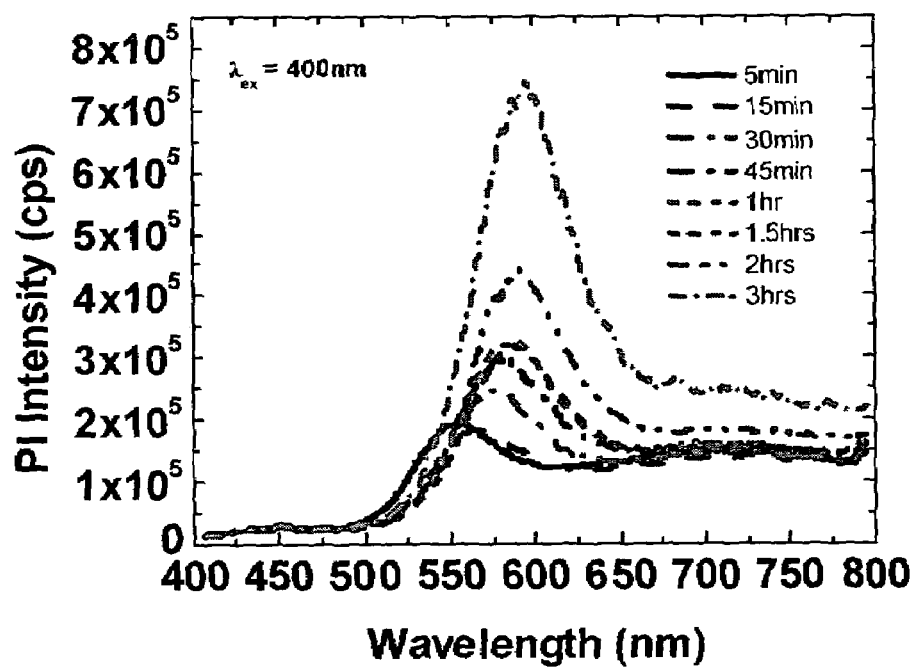

Using the same procedure described above (Synthesis of InP cores used to make core-shell nanoparticles) a study of the growth of InP nanocrystals was conducted. For these reactions again approximately 500 μmoles of In(Myr)$_3$ was placed in the reaction vessel within the glove box, along with approximately 250 μmoles P(SiMe$_3$)$_3$ which was, placed into a 5 dram vial containing about 3–4 mL of ODE. Both containers were removed from the glove box and the reaction vessel was attached to the Schlenk line. With Ar(g) flow, 40 mL of dry ODE was added, then a vacuum was established and with stirring, the temperature was set to 100° C. After about 1 hour, the vessel was backfilled with Ar(g) and the temperature was set to 305° C. At about 290° C. a 0.5 mL aliquot was injected directly into about 5 mL of room temperature hexanes. Then immediately upon reaching 300° C., the phosphine solution was rapidly injected (T=0 min). After 1 min, 40 ml of ODE was rapidly injected and the reaction temperature was set to 250° C. (or the growth temperature). Aliquots of the reaction mixture (0.5 mL) were immediately quenched (~5 mL hexanes or chloroform) periodically in order to follow the growth by UV-Vis and PL. FIG. 4 depicts a sample of the typical UV-Vis and PL data that was obtained through one of these reactions.

Example 15

Drying Procedure for Zn(Ac)$_2$.2H$_2$O and Cd(Ac)$_2$.2H$_2$O

Approximately 15 grams of Zn(Ac)$_2$.2H$_2$O and a large oval stir bar was placed into a 500 ml one-neck round-bottom flask. Then 60 ml of ODE was directly added, a condenser was connected and the system was connected to the Schlenk line. Then the entire system was placed under vacuum and the temperature was set to 130° C. After 24 hours, the system was cooled to room temperature and backfilled with Ar(g), at which time most of the ODE was decanted off. Then a medium porosity frit was connected directly to the round bottom flask containing the Zn(Ac)$_2$ and a 300 ml Schlenk flask was connected to the other end of the frit. After the vacuum was reestablished using the Schlenk line, approximately 100 ml of dry pentane was vacuum distilled into the Schlenk flask. After washing the Zn(Ac)$_2$ three times with the dry pentane, flask-to-flask vacuum distillation at room temperature was used to remove all of the volatiles. Then the entire apparatus was taken into the glove box where the dry Zn(Ac)$_2$ was stored and used as needed. Cd(Ac)$_2$.2H$_2$O was dried following the exact same procedure as described for Zn(Ac)$_2$.2H$_2$O.

Example 16

Synthesis of CdSe Shell

Figure 5A:
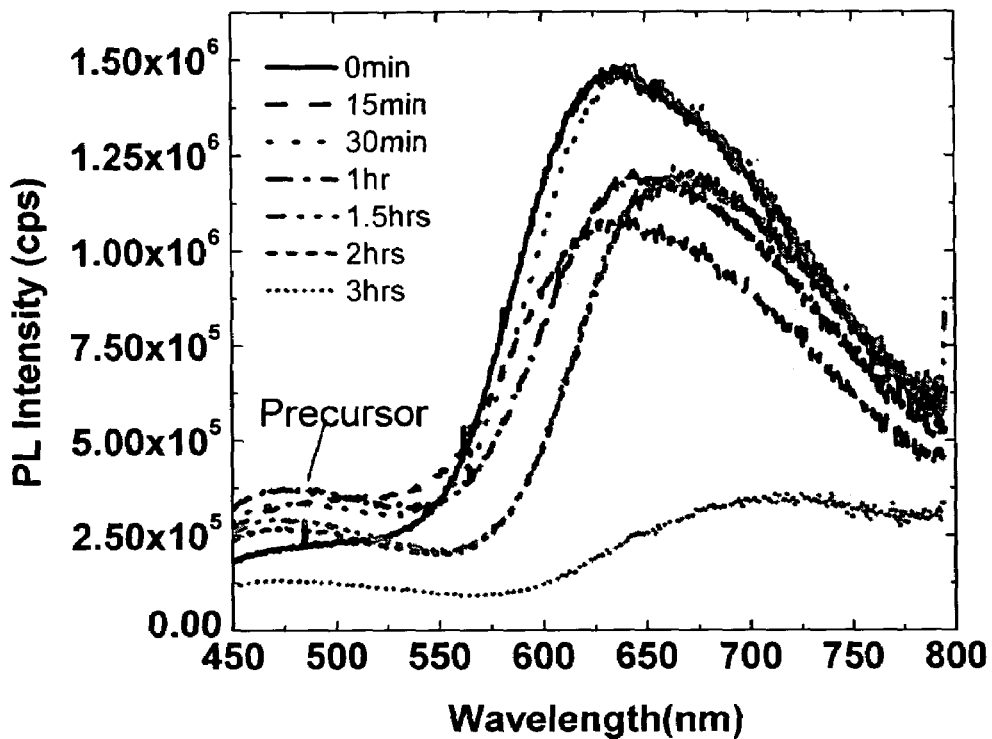
FIGS. 5A and 5B are graphic representations showing Uv-vis and PL of aliquots of InP/CdSe core-shell nanocrystals.
Figure 5B:
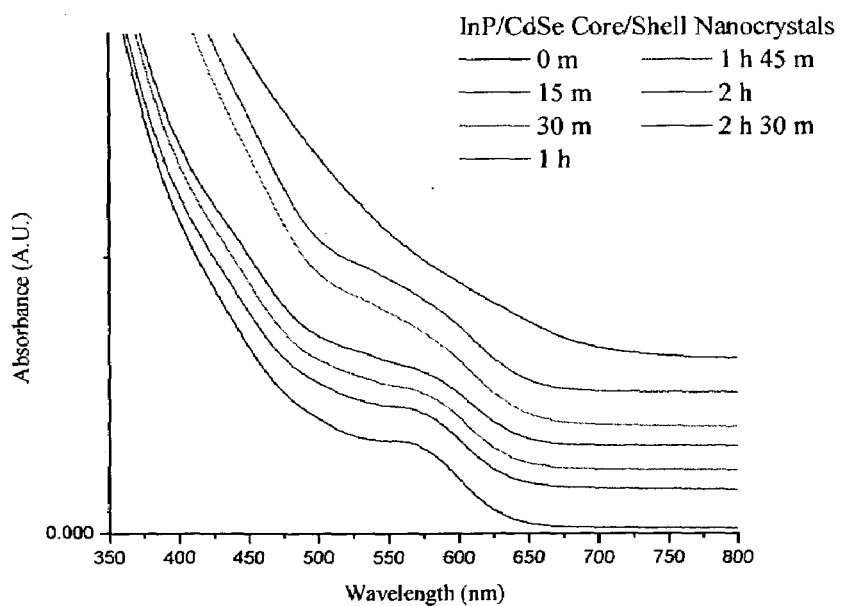
Figure 6A:
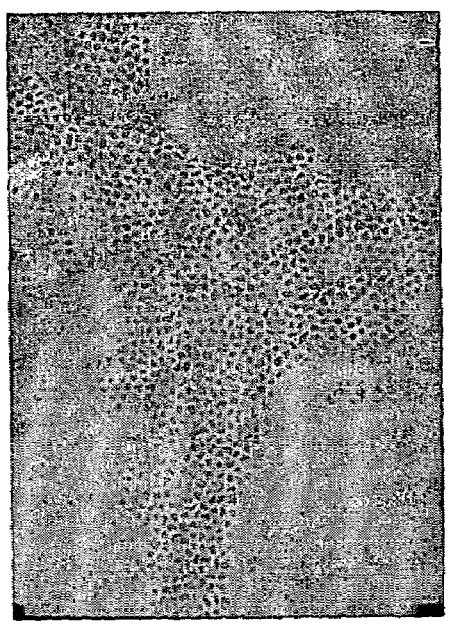
FIG. 6A is a TEM micrograph.
Figure 6B:
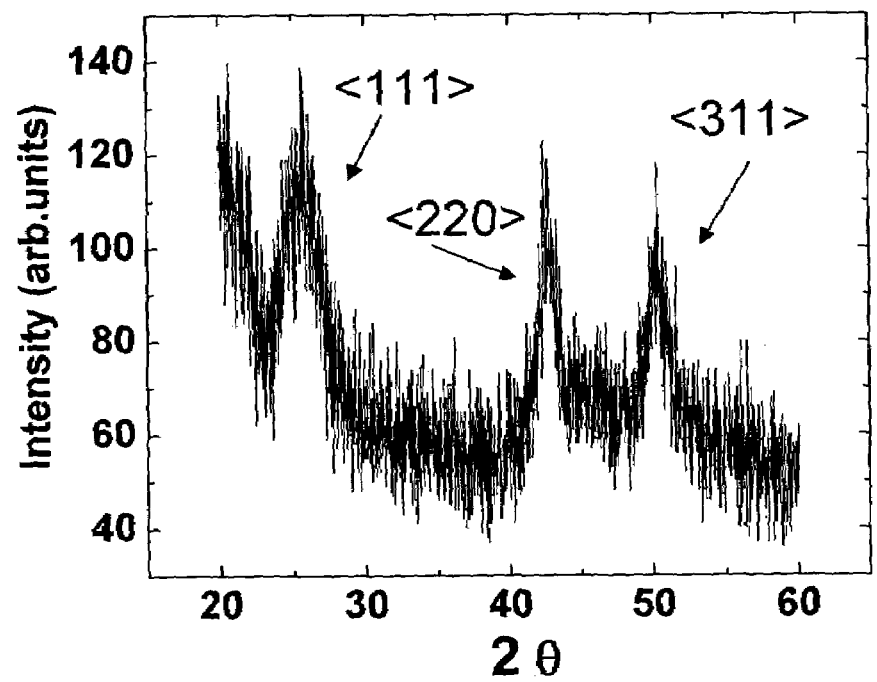
FIG. 6B shows X-ray diffraction, of InP/CdSe core-shell nanocrystals.

In the glove box a three neck reaction vessel was charged with 61.6 mg (267 μmoles) of Cd(Ac)$_2$, 21.1 mg (267 μmoles) of Se powder, a stir bar and equipped with a glass thermometer holder, a reflux condenser and a rubber septum. The reaction flask was then taken to the Schlenk line where, the InP Core solution previously described was injected, (approximately 125 μmoles InP in 40 ml ODE). The vessel was then placed under vacuum at room temperature for 45 minutes. Then the temperature was set to 140° C., after the solution refluxed for 10 minutes, the vessel was backfilled with Ar(g). Once the temperature reached 140° C., the reaction was considered started (T=0 min). The reaction was monitored by placing 0.5 ml aliquots in 5–7 ml of CHCl$_3$ after 0 m, 5 m, 15 m, 30 m, 1 h, 1.5 h, and 2 h. FIG. 5 depicts a sample of the UV-Vis and PL data collected from a typical reaction. After 2 hours, the reaction vessel was removed from the heat source and allowed to cool to room temperature. Once cooled, the reaction mixture was distributed evenly in two centrifuge tubes and centrifuged at 20° C. for 10 min at 10,000 rpm. The supernatants were decanted into two clean centrifuge tubes, and then filled to the top with acetone with the precipitate being disposed of. Then centrifugation of these samples at 20° C. for 20 min at 10,000 rpm yielded the InP/CdSe nanoparticles as a red-orange oily precipitate. Repeated dissolution in CHCl$_3$ and precipitation using acetone followed by centrifugation led to the final red-orange powder (three to four washings) which was analyzed by x-ray diffraction ("XRD"), energy dispersive spectroscopy ("EDS"), low resolution transmission electron microscopy ("LRTEM"), high resolution transmission electron microscopy ("HRTEM"), Raman spectroscopy ("Raman"), and Fourier transform infrared absorption spectroscopy ("FTIR", "IR"). FIG. 6 shows a LRTEM and XRD of particles prepared by this procedure.

Example 17

Synthesis of CdS Shell

Figure 7A:
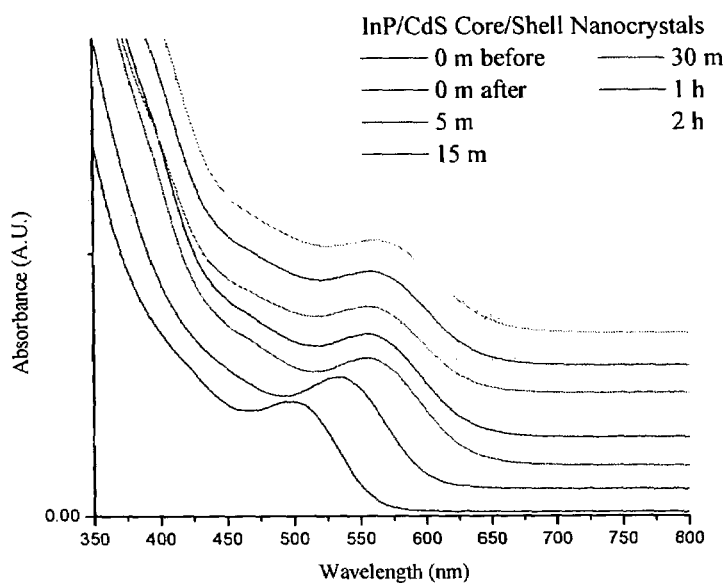
FIGS. 7A and 7B are graphic representations showing Uv-vis and PL of aliquots of InP/CdS core-shell nanocrystals.
Figure 7B:
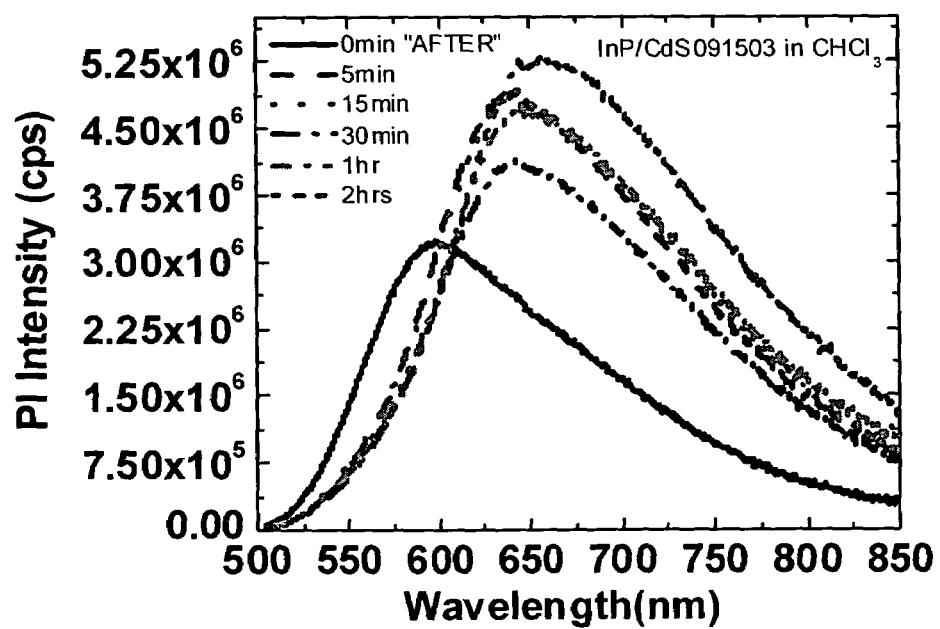

This synthesis was done exactly as described for InP/CdSe, except 69.5 mg (302 μmoles) of Cd(Ac)$_2$ and 9.7 mg (302 μmoles) of Sulfur was used as the shell precursors. The final product was an orange powder. FIG. 7 shows the UV-Vis and PL data obtained from this reaction.

Example 18

Synthesis of ZnSe shell

This synthesis was done exactly as described for InP/CdSe, except 62.8 mg (342 μmoles) of Cd(Ac)$_2$ and 27.0 mg (342 μmoles) of Selenium was used as the shell precursors. The final product was an orange powder.

Example 9

Synthesis of ZnS Shell

Figure 8A:
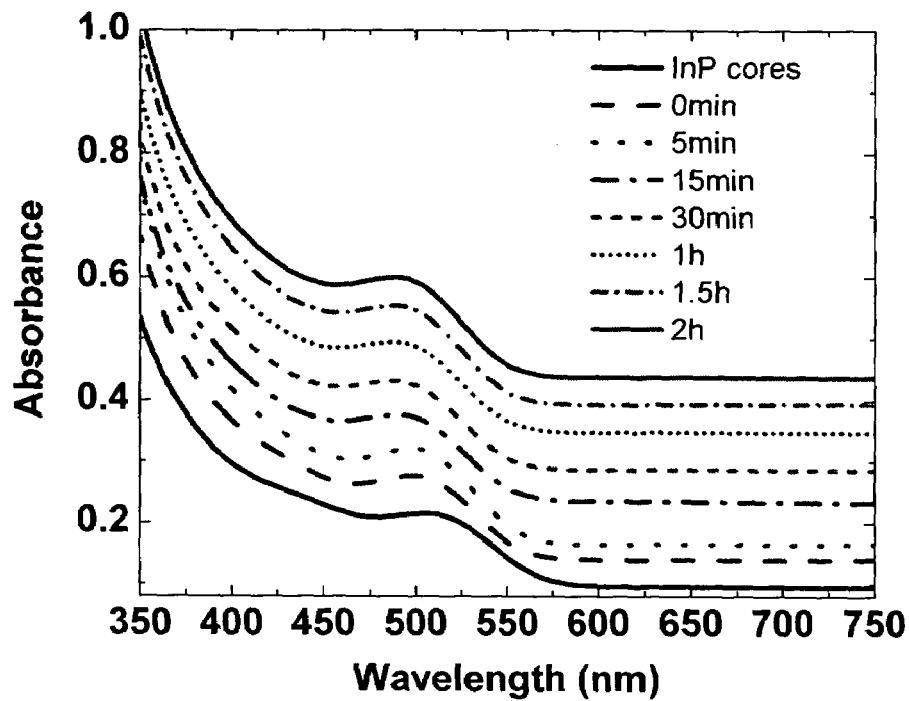
FIGS. 8A and 8B are graphic representations showing Uv-vis and PL of aliquots of InP/ZnS core-shell nanocrystals.
Figure 8B:
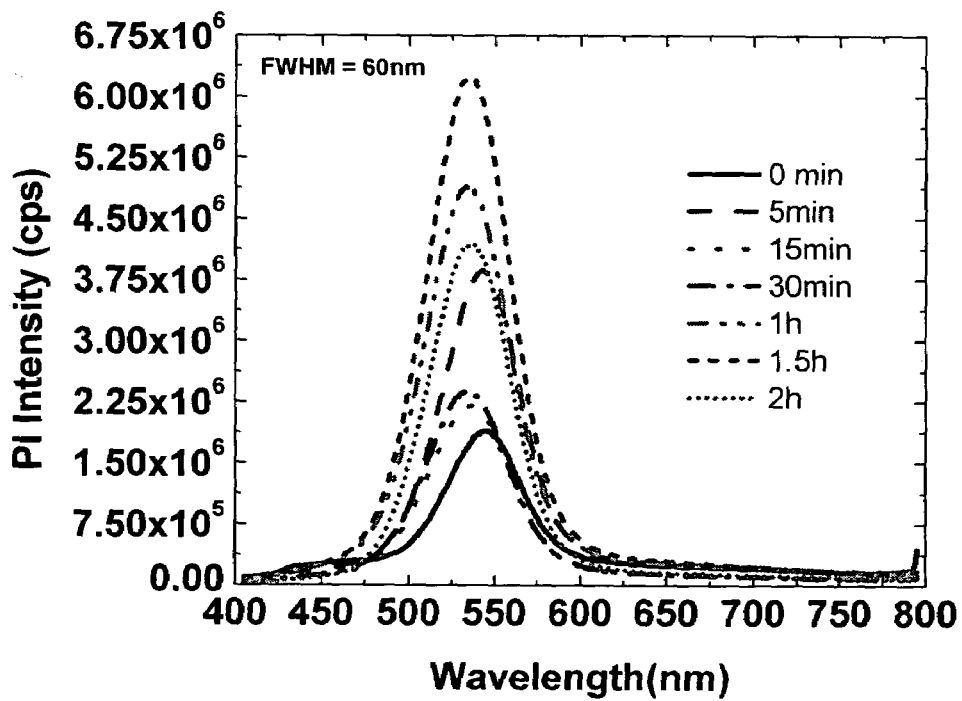
Figure 9:
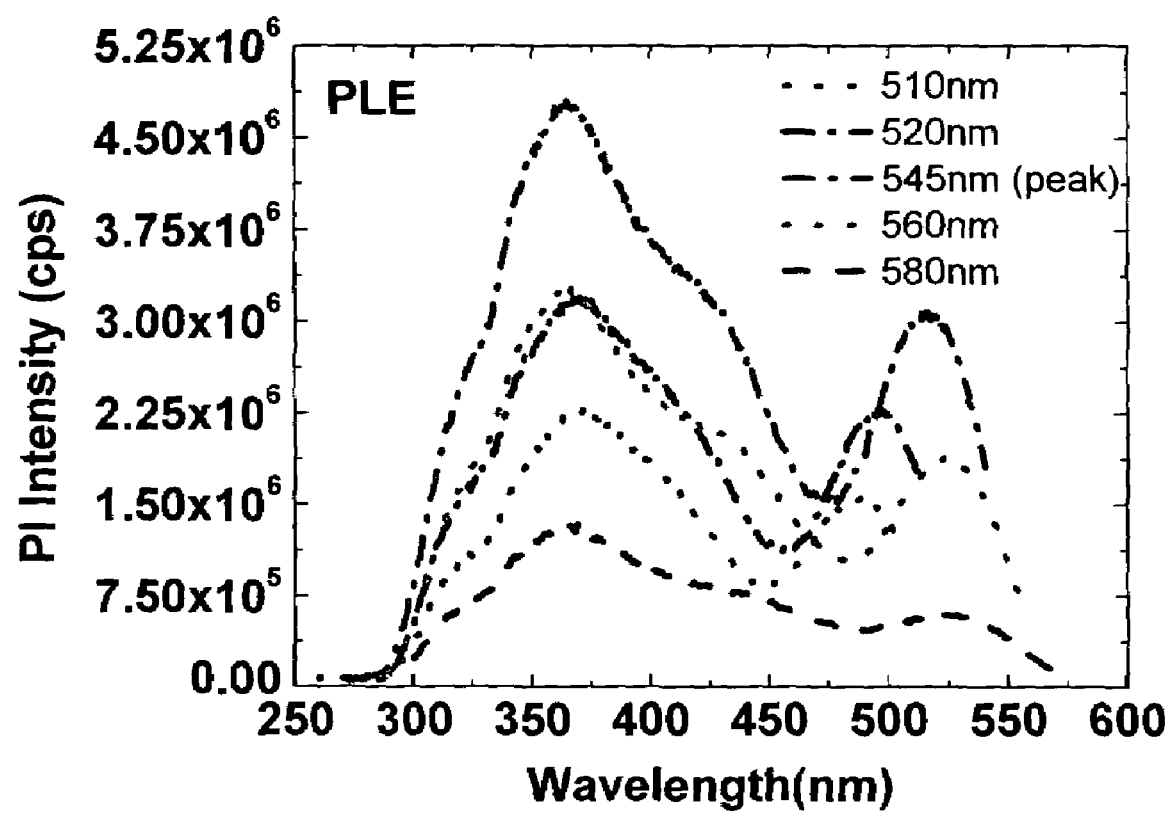
FIG. 9 is a graphic representation of a photoluminescence excitation spectra plot of 1.5 hour aliquot sample of INP/ZnS core-shell nanocrystals with emission varied between 510–580 nm.
Figure 10A:
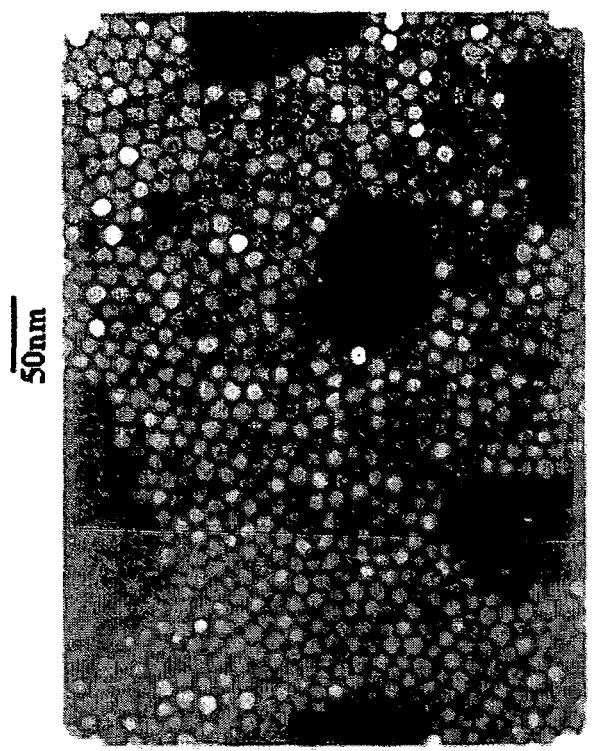
FIG. 10A is a TEM micrograph.
Figure 10B:
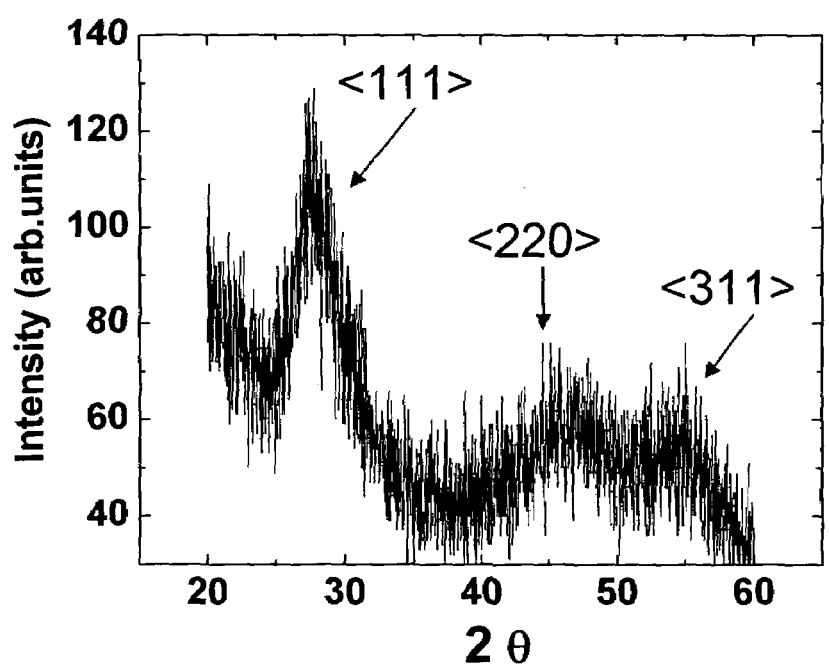
FIG. 10B shows X-ray diffraction, of InP/ZnS core-shell nanocrystals.
Figure 11:
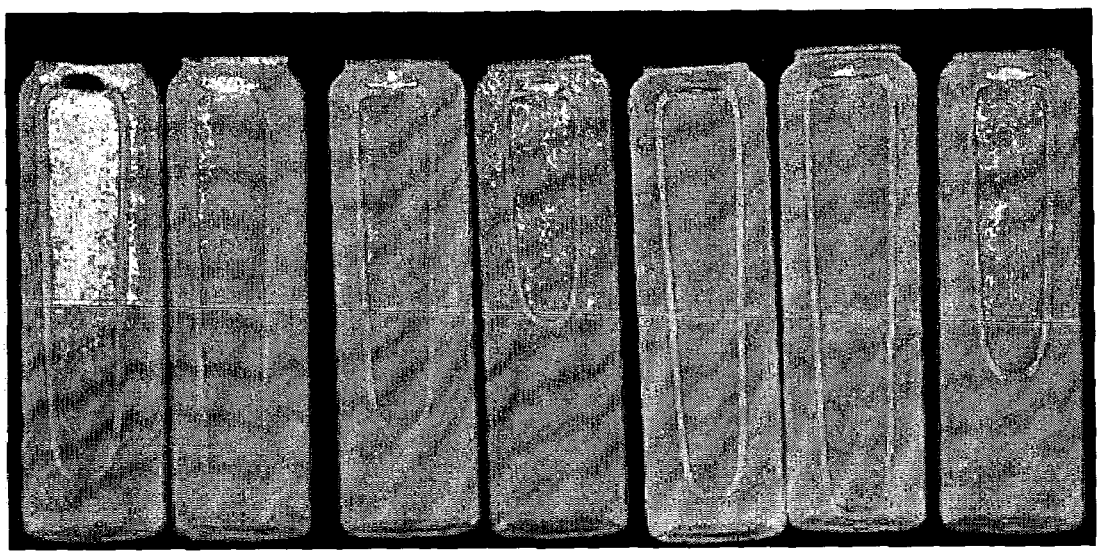
FIG. 11 is a photograph of various InP core and InP-II/VI and core-shell nanocrystals excited at 345 nm displaying the emission throughout the visible spectrum.
Figure 12A:
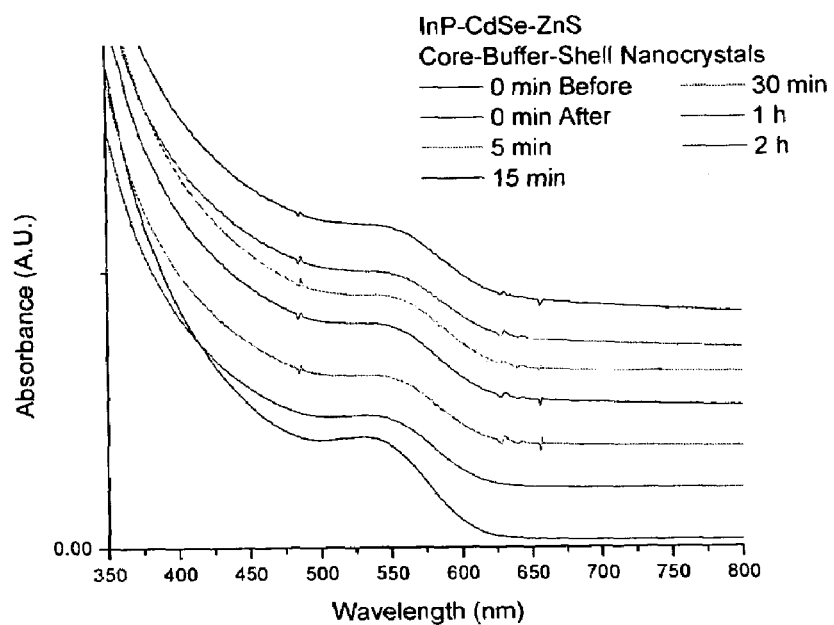
FIGS. 12A and 12B are graphic representations showing Uv-vis and PL of aliquots of InP/CeSe/ZnS core-buffer-shell nanocrystals.
Figure 12B:
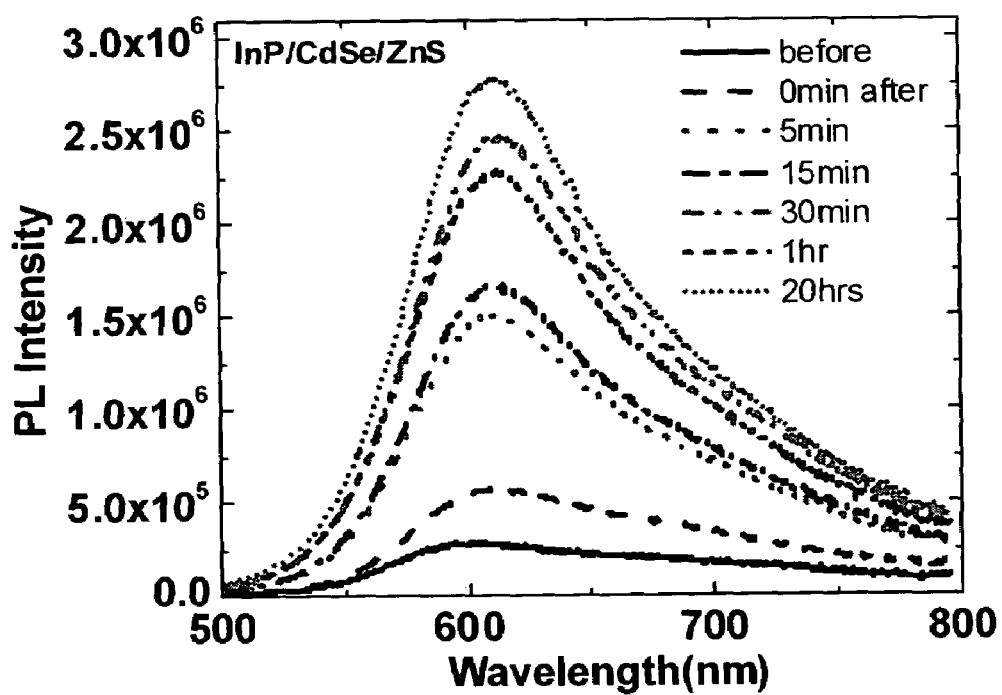

This synthesis was done exactly as described for InP/CdSe, except 70.0 mg (381 μmoles) of Cd(Ac)$_2$ and 12.2 mg (381 μmoles) of Sulfur was used as the shell precursors. The final product was an orange-yellow powder. FIG. 8 shows the UV-vis and PL data obtained from this reaction. FIG. 9 shows the photoluminescence emission ("PLE") spectra of the 1.5 hour sample. FIG. 10 shows a LRTEM and XRD of particles prepared by this procedure. FIG. 11 provides a picture of various InP core and InP-II/VI core-shell nanocrystals dispersed in hexanes or chloroform displaying the various luminescence possible throughout the visible spectrum. FIG. 12 shows the UV-Vis and PL data obtained from a reaction conducted exactly as described in this example on InP/CdSe nanocrystals resulting in InP/CdSe/ZnS core-buffer-shell nanocrystals.

Example 20

Typical CdSe Nanocrystal Synthesis

Figure 13A:
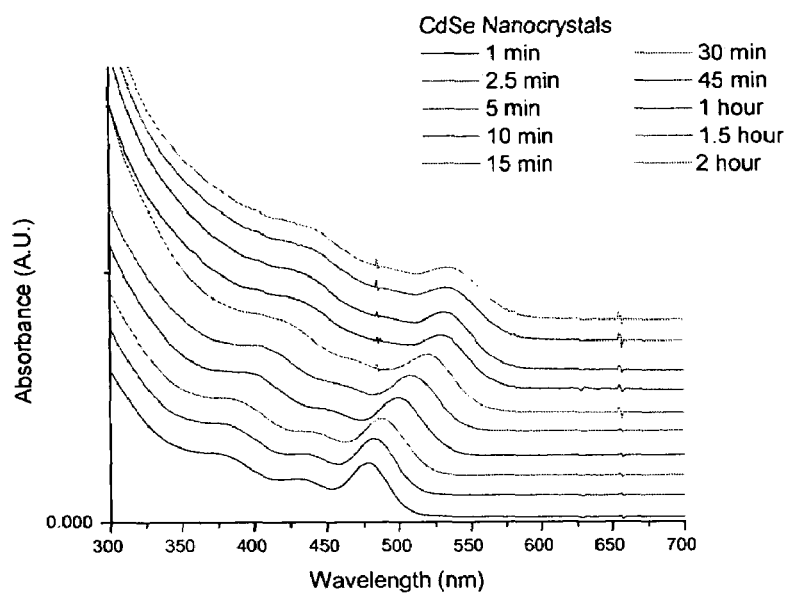
FIGS. 13A and 13B are graphic representations showing Uv-vis and PL of aliquots of CdSe nanocrystals.
Figure 13B:
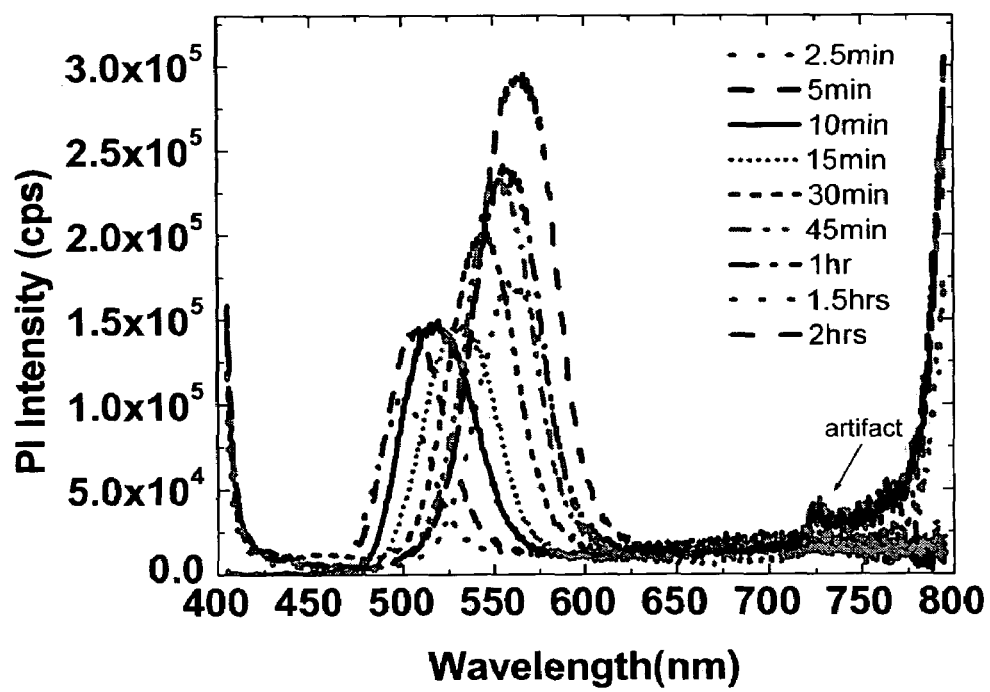
Figure 14:
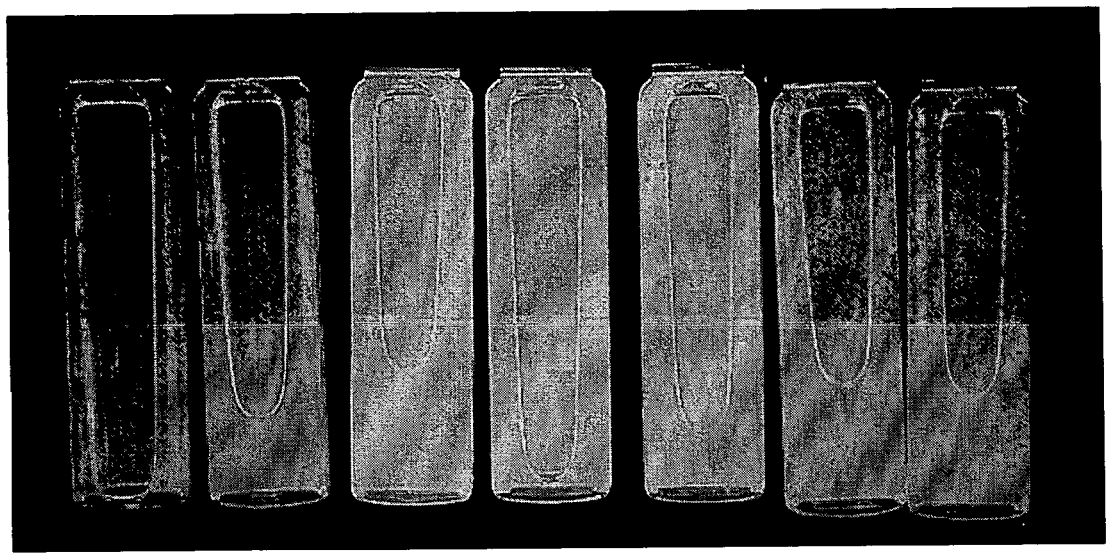
FIG. 14 is a photograph of a single batch of CdSe nanocrystals excited at 345 nm displaying the emission throughout the visible spectrum.
Figure 15A:
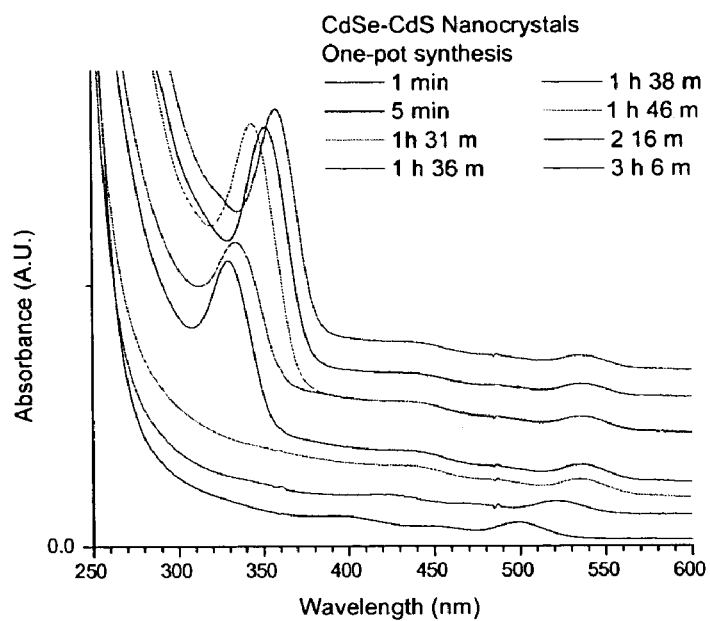
FIGS. 15A and 15B are graphic representations showing Uv-vis and PL of aliquots of CdSe—CdS core-shell nanocrystals.
Figure 15B:
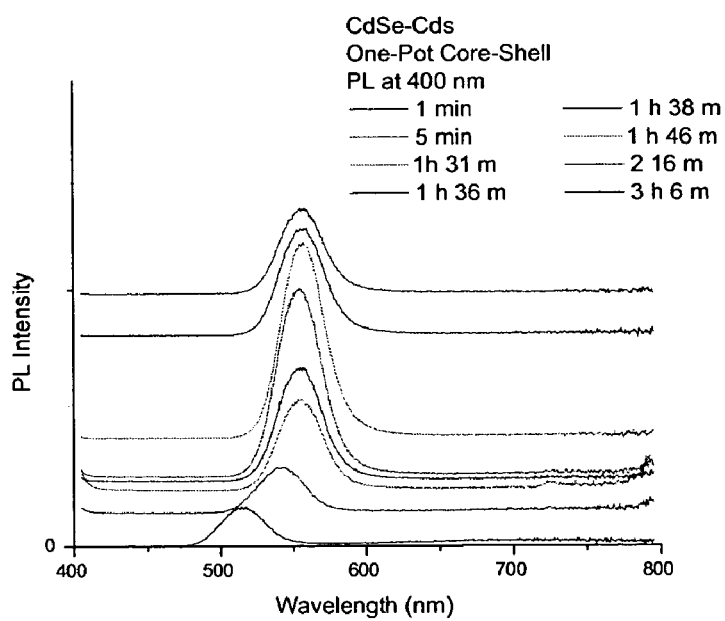

Within the glove box the reaction vessel was loaded with a stir bar and the Cadmium precursor (approximately 500 µmoles) and set-up as described for InP nanocrystal synthesis. Also within the glove box, 0.25 mL of a 1.0 M Se solution in tri-n-butylphosphine ("TBPSe") and approximately 4 mL of dry octadecene was placed in a 10 mL vial which is capped with a rubber septa. The reaction vessel was placed in a 500 mL round-bottom heating mantle which was filled with sand. Then the reaction vessel was connected to a Schlenk line via the 24/40 ground glass joint atop the reflux condenser and with argon flow, 40 mL of octadecene was added via syringe. Next with the stirrer going, the temperature was set to 100° C. and the reaction vessel was placed under vacuum. After 1 hour, the vessel containing a colorless optically clear solution was backfilled with Ar(g) and the temperature was set to the desired reaction temperature (200–300° C.). Once the reaction temperature was reached, the TPBSe solution was rapidly injected via a 10 mL syringe. The solution gradually changed color from clear, colorless to transparent yellow, then transparent orange, then transparent light red, then transparent bright red and finally transparent dark red the rate and extent of color change depended on reaction temperature and time. Aliquots of the reaction mixture (0.5 mL in approximately 5 mL chloroform) were taken at various times to be able to follow the growth process. All reactions were stopped after 2 hours by removing from the heat source and gradually cooling to room temperature. UV-vis and PL analysis was done on all aliquots without any further workup or treatment. FIG. 13 shows the UV-vis and PL data obtained from a typical reaction, and FIG. 14 provides a picture of various aliquots of CdSe nanocrystals dispersed in chloroform throughout one reaction displaying the various colors obtainable throughout the visible spectrum.

Example 21

Preparation of CdSe Samples for XRD, IR and Raman Analysis

The room temperature reaction mixture was placed directly into centrifuge tubes and centrifuged at 20° C. for 20 min at 11000 rpm to generally precipitate out all products as well as starting materials. This was proven by taking UV-vis of the supernatant octadecene solution. Then chloroform was added directly to the precipitated product after 30 min stirring, the mixture was centrifuged 10 min 20° C. at 11000 rpm. A precipitate formed at the top and the bottom of the centrifuge tube. The precipitate at the top was mainly unreacted Cd(acetate)$_2$ precursors while the precipitate at the bottom if any was the product CdSe nanocrystals. Via careful extraction, the top precipitate was removed from the vessel and this was again treated with about 10–15 mL CHCl$_3$, stirred and centrifuged to extract all nanocrystals form the precursors. This was repeated at least three times. Then, the chloroform layers were all combined and with either acetone or methanol, all the nanocrystals were precipitated. Centrifugation followed by decantation resulted in purified CdSe nanocrystals. These particles were then analyzed by x-ray diffraction, after which an CsI pellet was made for IR and Raman studies.

Example 22

One-Pot Synthesis of CdSe—CdS Core-Shell Nanocrystals

Within the glove box, 352.5 mg Cd(Stearate)$_2$ (519 µmoles) and a stir bar was placed into the reaction vessel and it was set-up as described for the synthesis of CdSe above. Also within the glove box, one 4 dram vial was loaded with 0.25 mL 1.0 M TBPSe (250 µmoles), about 3 mL of ODE and capped with a rubber septa. Another vial was loaded with 28.8 mg of S(SiMe$_3$)$_2$ (161 µmoles), about 3 mL of ODE and capped with a rubber septa. Then everything was removed from the glove box, the reaction vessel was immediately connected to the Schlenk line and placed under positive Ar(g) flow. Then 40 mL of ODE was injected into the reaction vessel, the temperature of the stirring solution was set to 100° C. and the system was placed under vacuum. After one hour, the system was backfilled with Ar(g) and the temperature was set to 245° C. Once the temperature reached 240° C., the TBPSe solution was injected and the reaction was started. After five minutes, an additional 40 mL of ODE was injected into the reaction vessel and the temperature was set to 150° C. After 1 hour 30 minutes, the S(SiMe$_3$)$_2$ solution was injected via syringe. The reaction vessel was removed from the heat bath and the reaction was considered finished after a total reaction time of 3 hours.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims that follow.

What is claimed is:

1. A process for producing III-V or II-VI nanocrystals comprising:
   (a) reacting a compound of formula (I) with a compound of formula (II)

$ML_n$              (I)

$E(SiR_3)_n$            (II)

wherein:
   n is 3, and M is a Group III metal, and E is a Group V element, or
   n is 2, and M is a Group II, and E is a Group VI element;
   L is a ligand; and
   R is selected from the group consisting of H, $—(CH_2)_m CH_3$, $—(C(CH_3)_2)_m CH_3$, $—(C(CH_3)_2)_m(CH_2)_z CH_3$, $—(CH_2)_m(C(CH_3)_2)_z CH_3$, and any combination thereof, wherein m and z are real numbers, in the absence of any surfactant, ligand, or coordinating solvent under conditions effective to produce homogeneous nucleation of seed III-V or II-VI nuclei and a compound of formula (III)

$$LSiR_3 \quad (III); \text{ and}$$

(b) permitting reaction to occur between the seed III-V or II-VI nuclei and the compound of formula (III) under conditions effective to produce III-V or II-VI nanocrystals.

2. The process as claimed in claim 1, wherein M is selected from the group consisting of Al, Ga, and In, and E is selected from the group consisting of N, P, As, and Sb.

3. The process as claimed in claim 1, wherein M is selected from the group consisting of Cd, Zn, Mg, and Hg, and E is selected from the group consisting of O, S, Se, and Te.

4. The process as claimed in claim 1, wherein L is selected from the group consisting of $-E^1R^1_2$, $-E^2R^1$, $-E^2C(O)R^1$, and beta-diketonates or beta-diketonate derivatives, wherein:

$E^1$ is a Group V element;
$E^2$ is a Group VI element; and
$R^1$ is selected from the group consisting of H, $-(CH_2)_m CH_3$, $-(C(CH_3)_2)_m CH_3$, $-(C(CH_3)_2)_m(CH_2)_z CH_3$, $-(CH_2)_m(C(CH_3)_2)_z CH_3$, and any combination thereof, wherein m and z are real numbers.

5. The process as claimed in claim 1, wherein R is alkyl.

6. The process as claimed in claim 5, wherein R is methyl.

7. The process as claimed in claim 1, wherein the compound of formula (I) is present in solution with a non-coordinating solvent.

8. The process as claimed in claim 7, wherein the non-coordinating solvent is selected from the group consisting of benzene, toluene, xylene, decane, and octadecene.

9. A process for producing nanocrystals having multiple layers of III-V or II-VI material comprising:

(a) reacting a compound of formula (I) with a compound of formula (II)

$$ML_n \quad (I)$$

$$E(SiR_3)_n \quad (II)$$

wherein:
n is 3, and M is a Group III metal, and E is a Group V element, or
n is 2, and M is a Group II, and E is a Group VI element;
L is a ligand; and
R is selected from the group consisting of H, $-(CH_2)_m CH_3$, $-(C(CH_3)_2)_m CH_3$, $-(C(CH_3)_2)_m(CH_2)_z CH_3$, $-(CH_2)_m(C(CH_3)_2)_z CH_3$, and any combination thereof, wherein m and z are real numbers, in the absence of any surfactant, ligand, or coordinating solvent under conditions effective to produce homogeneous nucleation of seed III-V or II-VI nuclei and a compound of formula (III)

$$LSiR_3 \quad (III);$$

(b) permitting reaction to occur between the seed III-V or II-VI nuclei and the compound of formula (III) under conditions effective to produce III-V or II-VI nanocrystals; and (c) reacting the product of step (b) with a source of a Group III metal and a Group V element, or with a source of a Group II metal and a Group VI element, under conditions effective to produce nanocrystals having multiple layers of III-V or II-VI material.

10. The method according to claim 9, wherein the multiple layers of III-V or II-VI material comprise the same material.

11. The method according to claim 9, wherein the multiple layers of III-V or II-VI material comprise different materials.

12. The method as claimed in claim 9, further comprising after step (c), one or more sequential reacting steps comprising reacting the product of the previous step with a source of a Group III metal and a Group V element, or with a source of a Group II metal and a Group VI element, under conditions effective to produce nanocrystals having multiple layers of III-V or II-VI material.

13. The method according to claim 12, wherein the multiple layers of III-V or II-VI material comprise the same material.

14. The method according to claim 12, wherein the multiple layers of III-V or II-VI material comprise different materials.

15. The process as claimed in claim 9, wherein M is selected from the group consisting of Al, Ga, and In, and E is selected from the group consisting of N, P, As, and Sb.

16. The process as claimed in claim 9, wherein M is selected from the group consisting of Cd, Zn, Mg, and Hg, and E is selected from the group consisting of O, S, Se, and Te.

17. The process as claimed in claim 9, wherein L is selected from the group consisting of $-E^1R^1_2$, $-E^2R^1$, $-E^2C(O)R^1$, and beta-diketonates or beta-diketonate derivatives, wherein:

$E^1$ is a Group V element;
$E^2$ is a Group VI element; and
$R^1$ is selected from the group consisting of H, $-(CH_2)_m CH_3$, $-(C(CH_3)_2)_m CH_3$, $-(C(CH_3)_2)_m(CH_2)_z CH_3$, $-(CH_2)_m(C(CH_3)_2)_z CH_3$, and any combination thereof, wherein m and z are real numbers.

18. The process as claimed in claim 9, wherein R is alkyl.

19. The process as claimed in claim 18, wherein R is methyl.

20. The process as claimed in claim 9, wherein the compound of formula (I) is present in solution with a non-coordinating solvent.

21. The process as claimed in claim 20, wherein the non-coordinating solvent is selected from the group consisting of benzene, toluene, xylene, decane, and octadecene.

22. The process as claimed in claim 9, wherein the source of a Group III metal or the source of a Group II metal is a compound of formula (IV):

$$MX_n \quad (IV)$$

wherein
X is selected from the group consisting of Cl, carboxylate, carbonate, $-E^1R^1_2$, $-E^2R^1$, $-E^2C(O)R^1$, and beta-diketonates or beta-diketonate derivatives, wherein:
$E^1$ is a Group V element;
$E^2$ is a Group VI element; and
$R^1$ is selected from the group consisting of H, $-(CH_2)_m CH_3$, $-(C(CH_3)_2)_m CH_3$, $-(C(CH_3)_2)_m (CH_2)_z CH_3$, $-(CH_2)_m(C(CH_3)_2)_z CH_3$, and any combination thereof, wherein m and z are real numbers.

23. A process for producing nanocrystals having multiple layers of III-V or II-VI material comprising:

(a) providing a supply of seed III-V or II-VI nanocrystals; and (b) reacting the seed III-V or II-VI nanocrystals with a source of a Group III metal and a Group V element, or with a source of a Group II metal and a Group VI element in the absence of any surfactant, ligand, or coordinating solvent, under conditions effective to produce nanocrystals having multiple layers of III-V or II-VI material.

24. The method according to claim 23, wherein the multiple layers of III-V or II-VI material comprise the same material.

25. The method according to claim 23, wherein the multiple layers of III-V or II-VI material comprise different materials.

26. The method as claimed in claim 23, further comprising after step (b), one or more sequential reacting steps comprising reacting the product of the previous step with a source of a Group III metal and a Group V element, or with a source of a Group II metal and a Group VI element, under conditions effective to produce nanocrystals having multiple layers of III-V or II-VI material.

27. The method according to claim 26, wherein the multiple layers of III-V or II-VI material comprise the same material.

28. The method according to claim 26, wherein the multiple layers of III-V or II-VI material comprise different materials.

29. The process as claimed in claim 23, wherein the source of a Group III metal or the source of a Group II metal is a compound of formula (IV):

$$MX_n \quad (IV)$$

wherein
n is 3, and M is a Group III metal, or
n is 2, and M is a Group II;
X is selected from the group consisting of Cl, carboxylate, carbonate, $-E^1R^1_2$, $-E^2R^1$, $-E^2C(O)R^1$, and beta-diketonates or beta-diketonate derivatives, wherein:
$E^1$ is a Group V element;
$E^2$ is a Group VI element; and
$R^1$ is selected from the group consisting of H, $-(CH_2)_m CH_3$, $-(C(CH_3)_2)_m CH_3$, $-(C(CH_3)_2)_m (CH_2)_z CH_3$, $-(CH_2)_m(C(CH_3)_2)_z CH_3$, and any combination thereof, wherein m and z are real numbers.

30. A process for producing a compound of formula (VII)

$$M^1(ER^3_x)_3, \text{ comprising:}$$

(a) reacting a compound of formula (V) with a compound of formula (VI)

$$M^1(C_5R^2_kH_{5-k})_3 \quad (V)$$

$$HER^3_x \quad (VI)$$

wherein:
$M^1$ is a Group III metal;
$R^2$ is selected from the group consisting of H, $-(CH_2)_m CH_3$, $-(C(CH_3)_2)_m CH_3$, $-(C(CH_3)_2)_m(CH_2)_z CH_3$, $-(CH_2)_m(C(CH_3)_2)_z CH_3$, and any combination thereof, wherein m and z are real numbers;
k is 0–5;
x is 2, and E is a Group V element or
x is 1, and E is a Group VI element; and
$R^3$ is selected from the group consisting of H, $-(CH_2)_m CH_3$, $-(C(CH_3)_2)_m CH_3$, $-(C(CH_3)_2)_m(CH_2)_z CH_3$, $-(CH_2)_m(C(CH_3)_2)_z CH_3$, and any combination thereof, wherein m and z are real numbers, and when x is 1, $R^3$ may additionally be $C(O)R^3$,
under conditions effective to produce a compound of formula (VII).

31. The process as claimed in claim 30, wherein $M^1$ is selected from the group consisting of Al, Ga, and In.

32. The process as claimed in claim 30, wherein x is 2, and E is selected from the group consisting of N, P, As, and Sb.

33. The process as claimed in claim 30, wherein x is 1, and E is selected from the group consisting of O, S, Se, and Te.

34. The process as claimed in claim 30, wherein the compound of formula (V) is selected from the group consisting of $In(C_5H_5)_3$, $In(C_5H_4Me)_3$, $In(C_5Me_5)_3$, and $In(C_5H_4(CH_2C(CH_3)_3))$.

35. The process as claimed in claim 30, wherein the compound of formula (VI) is selected from the group consisting of myristic acid, stearic acid, lauric acid, decanoic acid, 1-octadecanol, 1-octadecanethiol, dodecylamine, dioctadecylamine, dioctylphosphine, and diocyadecylarsine.

36. The process as claimed in claim 30, wherein the compound of formula (VII) is selected from the group consisting of $In(Myristate)_3$, $In(Laurate)_3$, $In(Stearate)_3$, $In(Decanoate)_3$, $In(octadecanoate)_3$, $In(octadecanethiolate)_3$, $In(N(C_{12}H_{25})_2)_3$, $In(N(C_{18}H_{37})_2)_3$, $In(P(C_{18}H_{37})_2)_3$, and $In(As(C_{18}H_{37})_2)_3$.

* * * * *